United States Patent
Shimada et al.

(10) Patent No.: US 10,241,429 B2
(45) Date of Patent: Mar. 26, 2019

(54) ELECTROPHOTOGRAPHIC PHOTOSENSITIVE MEMBER, PROCESS CARTRIDGE AND ELECTROPHOTOGRAPHIC APPARATUS

(71) Applicant: CANON KABUSHIKI KAISHA, Tokyo (JP)

(72) Inventors: Tsuyoshi Shimada, Toride (JP); Kumiko Takizawa, Saitama (JP); Eileen Takeuchi, Toride (JP); Ikuyo Kuroiwa, Tokyo (JP); Wataru Kitamura, Abiko (JP); Kan Tanabe, Matsudo (JP); Haruhiko Mitsuda, Nagareyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/960,916

(22) Filed: Apr. 24, 2018

(65) Prior Publication Data
US 2018/0314173 A1    Nov. 1, 2018

(30) Foreign Application Priority Data

Oct. 10, 2017  (JP) ................................ 2017-196814
Apr. 19, 2018  (JP) ................................ 2018-080774

(51) Int. Cl.
*G03G 5/14*     (2006.01)
*G03G 7/00*     (2006.01)
*G03G 15/02*    (2006.01)
*G03F 7/09*     (2006.01)
*B82Y 30/00*    (2011.01)

(52) U.S. Cl.
CPC .......... *G03G 7/0086* (2013.01); *G03F 7/092* (2013.01); *G03G 15/0216* (2013.01); *B82Y 30/00* (2013.01)

(58) Field of Classification Search
CPC ........ G03G 5/104; G03G 5/142; G03G 5/144; G03G 7/0053
See application file for complete search history.

(56) References Cited

U.S. PATENT DOCUMENTS

| | | |
|---|---|---|
| 5,198,685 A | 3/1993 | Kitani et al. |
| 5,876,890 A | 3/1999 | Kitamura et al. |
| 5,912,098 A | 6/1999 | Tanaka et al. |
| 6,183,922 B1 | 2/2001 | Takai et al. |
| 6,218,063 B1 | 4/2001 | Tanaka et al. |

(Continued)

FOREIGN PATENT DOCUMENTS

JP    2007-279620 A    10/2007

*Primary Examiner* — Hoa V Le
(74) *Attorney, Agent, or Firm* — Venable LLP

(57) ABSTRACT

There is provided an electrophotographic photosensitive member, a process cartridge and an electrophotographic apparatus that are excellent in charging properties and can suppress residual potential in the case where a strontium titanate particle is used as a metal oxide particle in an undercoat layer of the electrophotographic photosensitive member. An electrophotographic photosensitive member in which an undercoat layer contains a strontium titanate particle having a maximum peak at a position of $2\theta=32.20\pm0.20$ ($\theta$ represents a Bragg angle) in a CuKα characteristic X-ray diffraction pattern, the maximum peak having a half-value width of 0.10 deg or more and 0.50 deg or less, and a process cartridge and an electrophotographic apparatus each provided with the electrophotographic photosensitive member.

12 Claims, 5 Drawing Sheets

(56) References Cited

U.S. PATENT DOCUMENTS

| | | |
|---|---|---|
| 6,335,132 B1 | 1/2002 | Tanaka et al. |
| 6,405,005 B1 | 6/2002 | Kitamura et al. |
| 7,645,547 B2 | 1/2010 | Okuda et al. |
| 7,655,370 B2 | 2/2010 | Kitamura et al. |
| 7,813,675 B2 | 10/2010 | Tanabe et al. |
| 9,766,561 B2 | 9/2017 | Takahashi et al. |
| 9,791,792 B2 | 10/2017 | Miyauchi et al. |
| 9,811,012 B2 | 11/2017 | Murakami et al. |
| 9,817,324 B2 | 11/2017 | Kitamura et al. |
| 9,971,258 B2 | 5/2018 | Kitamura et al. |
| 9,983,490 B2 | 5/2018 | Shimada et al. |
| 2009/0245867 A1* | 10/2009 | Wada .................. G03G 5/0614 399/159 |
| 2014/0004450 A1 | 1/2014 | Tokimitsu et al. |
| 2017/0108790 A1 | 4/2017 | Takahashi et al. |

* cited by examiner

ELECTROPHOTOGRAPHIC PHOTOSENSITIVE MEMBER, PROCESS CARTRIDGE AND ELECTROPHOTOGRAPHIC APPARATUS

BACKGROUND OF THE INVENTION

Field of the Invention

The present invention relates to an electrophotographic photosensitive member, and a process cartridge and an electrophotographic apparatus each including the electrophotographic photosensitive member.

Description of the Related Art

In recent years, as an organic electrophotographic photosensitive member (hereinafter, referred to as "electrophotographic photosensitive member"), an electrophotographic photosensitive member including: an undercoat layer containing a metal oxide particle; and a photosensitive layer formed on the undercoat layer has been used.

As the metal oxide particle contained in the undercoat layer of the electrophotographic photosensitive member, various metal oxide particles are proposed. From the viewpoint of electrical properties, Japanese Patent Application Laid-Open No. 2007-279620 discloses a strontium titanate particle as the metal oxide particle contained in the undercoat layer.

SUMMARY OF THE INVENTION

According to studies conducted by the present inventors, it has been found that in the case where a strontium titanate particle having a particular X-ray diffraction pattern is used as the metal oxide particle in the undercoat layer of the electrophotographic photosensitive member, the electrical properties such as residual potential and charging properties can be improved to be further excellent.

The present invention intends to provide: an electrophotographic photosensitive member that can achieve both the residual potential and the charging properties at an excellent level in the case where the strontium titanate particle having a particular X-ray diffraction pattern is used as the metal oxide particle in the undercoat layer of the electrophotographic photosensitive member; and a process cartridge and an electrophotographic apparatus each including the electrophotographic photosensitive member.

The present invention relates to an electrophotographic photosensitive member including: a support; an undercoat layer; and a photosensitive layer in the mentioned order, in which the undercoat layer contains a binder resin and a strontium titanate particle, the strontium titanate particle has a maximum peak at a position of $2\theta=32.20\pm0.20$ ($\theta$ represents a Bragg angle) in a CuK$\alpha$ characteristic X-ray diffraction pattern, and a half-value width of the maximum peak is 0.10 deg or more and 0.50 deg or less.

According to the present invention, an electrophotographic photosensitive member that suppresses residual potential and that has good charging properties can be provided by using a strontium titanate particle having a particular X-ray diffraction pattern as a metal oxide particle in an undercoat layer of the electrophotographic photosensitive member.

Further features of the present invention will become apparent from the following description of exemplary embodiments with reference to the attached drawings.

DESCRIPTION OF THE EMBODIMENTS

Figure 1:
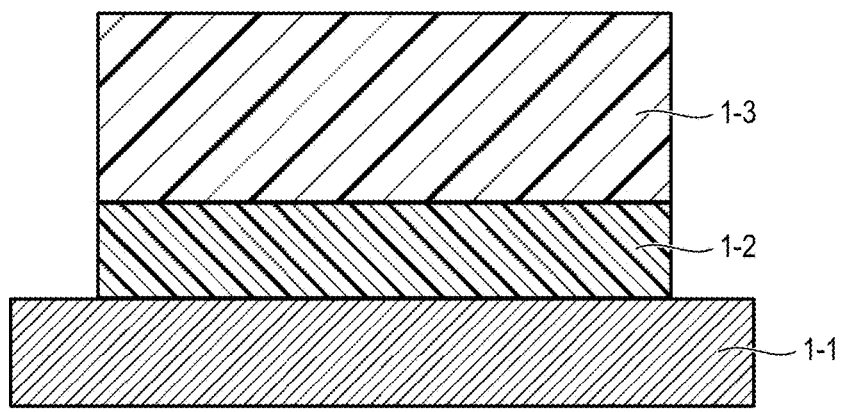
FIG. 1 is a diagram illustrating an example of a layer constitution of an electrophotographic photosensitive member according to the present invention.

Preferred embodiments of the present invention will now be described in detail in accordance with the accompanying drawings.

In an electrophotographic photosensitive member according to the present invention, and a process cartridge and an electrophotographic apparatus each including the electrophotographic photosensitive member, an undercoat layer of the electrophotographic photosensitive member contains a strontium titanate particle having a maximum peak at a position of $2\theta=32.20\pm0.20$ ($\theta$ represents a Bragg angle) in a CuK$\alpha$ characteristic X-ray diffraction pattern, the maximum peak having a half-value width of 0.10 deg or more and 0.50 deg or less.

The present inventors have conducted diligent studies to find that it is very important to control the half-value width of the X-ray diffraction peak at $2\theta=32.20\pm0.20$ ($\theta$ represents a Bragg angle) of the strontium titanate particle to 0.10 deg or more and 0.50 deg or less in order to attain an effect of achieving both good charging properties and suppression of residual potential.

In general, the half-value width of a diffraction peak in powder X-ray diffraction has a relationship with a crystallite diameter of an inorganic fine particle. A grain of a primary particle is constituted by a plurality of crystallites, and the crystallite diameter refers to the size of an individual crystallite that constitutes the primary particle.

In the present invention, the crystallite denotes an individual crystal grain that constitutes a particle, and the crystallites aggregate to make a particle. The size of the crystallite and the particle diameter of the particle have no relation with each other.

In general, when the crystallite diameter of an inorganic fine particle is small, the half-value width of a diffraction peak in powder X-ray diffraction becomes large, and when the crystallite diameter of an inorganic fine particle is large, the half-value width of a diffraction peak in powder X-ray diffraction becomes small.

When the crystallite diameter of an inorganic fine particle becomes small, grain boundaries between crystallites (crystal grain boundaries) that are present in a primary particle increase. It is considered that the crystal grain boundary is a point where a charge is trapped.

Therefore, in the case where the undercoat layer of the electrophotographic photosensitive member contains a strontium titanate particle, when the crystallite diameters of the crystallites of the strontium titanate particle are sufficiently small, the strontium titanate particle has a large number of crystal grain boundaries, and therefore the point where a charge is trapped increases to make charging properties good.

On the other hand, a charge easily flows in a crystallite of an inorganic fine particle. In the case where the undercoat layer of the electrophotographic photosensitive member contains a strontium titanate particle, when the crystallite diameters of the crystallites of the strontium titanate particle are sufficiently large, the crystal grain boundaries decrease to suppress excessive storage of charges, and therefore the residual potential can be reduced.

Accordingly, it is important to adjust the crystal grain boundaries of the strontium titanate particle appropriately in order to achieve both good charging properties and suppression of the residual potential.

The present inventors consider that by controlling the half-value width of the strontium titanate particle to 0.10 deg or more and 0.50 deg or less, the effect of achieving both the good charging properties and the suppression of the residual potential can be obtained.

The strontium titanate particle according to the present invention has a maximum peak at a position of $2\theta=32.20\pm0.20$ ($\theta$ represents a Bragg angle) in a CuK$\alpha$ characteristic X-ray diffraction pattern, and the half-value width of the maximum peak is 0.10 deg or more and 0.50 deg or less.

When the half-value width is less than 0.10 deg, the number of crystal grain boundaries of the strontium titanate particle is small as described above, and thus the charging properties are lowered.

In addition, when the half-value width is larger than 0.50 deg, the strontium titanate particle does not contain a crystallite having a sufficient size as described above, and therefore the residual potential becomes large.

Particularly, when the half-value width is 0.23 or more, an effect of achieving both better charging properties and the suppression of the residual potential can be obtained.

The number average particle diameter of the primary particles of the strontium titanate particle according to the present invention is not particularly limited but is preferably 10 nm or more and 150 nm or less, more preferably 10 nm or more and 95 nm or less from the viewpoint of electrical properties.

The strontium titanate particle according to the present invention may be surface-treated with a surface treating agent and is preferably surface-treated using a silane coupling agent. Particularly, the silane coupling agent more preferably has at least one functional group selected from the group consisting of alkyl groups, amino groups, and halogen groups from the viewpoint of electrical properties.

[Electrophotographic Photosensitive Member]

The electrophotographic photosensitive member according to the present invention includes, for example, an undercoat layer on a support and further, a photosensitive layer on the undercoat layer, as illustrated in FIG. 1. In FIG. 1, reference numeral 1-1 denotes the support, and reference numeral 1-2 denotes the undercoat layer, and reference numeral 1-3 denotes the photosensitive layer.

A method for producing the electrophotographic photosensitive member according to the present invention includes a method in which coating liquids for respective layers, which will be describe later, are prepared to conduct coating in the desired order of layers to be dried. In this method, a method for conducting coating with the coating liquids includes a dip coating method, a spray coating method, an inkjet coating method, a roll coating method, a die coating method, a blade coating method, a curtain coating method, a wire bar coating method, and a ring coating method. Among these coating methods, the dip coating method is preferable from the viewpoint of efficiency and productivity.

<Support>

The electrophotographic photosensitive member according to the present invention includes a support, and the support can be an electro-conductive support having electro-conductivity. In addition, examples of the shape of the support include a cylindrical shape, a belt shape and a sheet shape. Among these shapes, the support is preferably a cylindrical support. Further, an electrochemical treatment such as anodic oxidation, blast treatment or cutting treatment may be applied on the surface of the support, but blast treatment or cutting treatment is preferably performed.

The material of the support can be metals, resins, glass, and the like.

Examples of the metals include aluminum, iron, nickel, copper, gold, stainless steel and alloys thereof. Among these metals, the support is preferably an aluminum support using aluminum.

In addition, electro-conductivity may be imparted to resins and glass through a treatment such as mixing or coating with an electro-conductive material.

<Electro-Conductive Layer>

In the present invention, an electro-conductive layer may be provided on the support. When the electro-conductive layer is provided, scratches and unevenness on the surface of the support can be concealed, and reflection of light at the surface of the support can be controlled.

The electro-conductive layer can contain an electro-conductive particle and a resin.

Examples of the material of the electro-conductive particle include metal oxides, metals, and carbon black. Examples of the metal oxides include zinc oxide, aluminum oxide, indium oxide, silicon oxide, zirconium oxide, tin oxide, titanium oxide, magnesium oxide, antimony oxide, and bismuth oxide. Examples of the metals include aluminum, nickel, iron, nichrome, copper, zinc, and silver.

Among these materials, metal oxides are preferably used as the electro-conductive particle, and particularly, titanium oxide, tin oxide, and zinc oxide are more preferably used.

In the case where the metal oxide is used as the electro-conductive particle, the surface of the metal oxide may be treated with a silane coupling agent or the like, or the metal oxide may be doped with an element such as phosphorus or aluminum, or an oxide thereof.

In addition, the electro-conductive particle may be made to have a laminated structure including a core material and an enveloping layer that envelopes the core material. Examples of the core material include titanium oxide, barium sulfate, and zinc oxide. Examples of the enveloping layer include metal oxides such as tin oxide.

Moreover, in the case where the metal oxide is used as the electro-conductive particle, the metal oxide preferably has a volume average particle diameter of 1 nm or more and 500 nm or less, more preferably 3 nm or more and 400 nm or less.

Examples of the resin include polyester resins, polycarbonate resins, polyvinyl acetal resins, acrylic resins, silicone resins, epoxy resins, melamine resins, polyurethane resins, phenolic resins, and alkyd resins.

In addition, the electro-conductive layer may further contain a concealing agent such as silicone oil, a resin particle, or titanium oxide.

The average thickness of the electro-conductive layer is preferably 1 μm or more and 50 μm or less, particularly preferably 3 μm or more and 40 μm or less.

The electro-conductive layer can be formed in such a way that a coating liquid for an electro-conductive layer, the coating liquid containing the above-described respective materials and a solvent, is prepared, and a coating film of the coating liquid is formed on the support and then dried. Examples of the solvent to be used for the coating liquid include alcohol-based solvents, sulfoxide-based solvents, ketone-based solvents, ether-based solvents, ester-based solvents and aromatic hydrocarbon-based solvents. Examples of the method of dispersing the electro-conductive particle in the coating liquid for an electro-conductive layer include a method using a paint shaker, a sand mill, a ball mill or a liquid collision type high-speed disperser.

<Undercoat Layer>

In the present invention, the undercoat layer is provided on the support or the electro-conductive layer.

The undercoat layer of the electrophotographic photosensitive member according to the present invention contains the above-described strontium titanate particle and a binder resin.

Examples of the binder resin include polyester resins, polycarbonate resins, polyvinyl acetal resins, acrylic resins, epoxy resins, melamine resins, polyurethane resins, phenolic resins, polyvinyl phenolic resins, alkyd resins, polyvinyl alcohol resins, polyethylene oxide resins, polypropylene oxide resins, polyamide resins, polyamide acid resins, polyimide resins, polyamideimide resins and cellulose resins.

The binder resin may be prepared by subjecting a composition containing a monomer having a polymerizable functional group to polymerization. Examples of the polymerizable functional group of the monomer having a polymerizable functional group include an isocyanate group, a blocked isocyanate group, a methylol group, an alkylated methylol group, an epoxy group, a metal alkoxide group, a hydroxyl group, an amino group, a carboxyl group, a thiol group, a carboxylic anhydride group and a carbon-carbon double bond group.

In addition, the undercoat layer according to the present invention may further contain an electron accepting substance, an electron transporting substance, a metal oxide, a metal, an electro-conductive polymer, and the like for the purpose of enhancing electrical properties.

Examples of the electron accepting substance include quinone compounds, anthraquinone compounds, phthalocyanine compounds, porphyrin compounds, triphenylmethane compounds, fluorenylidenemalononitrile compounds and benzalmalononitrile compounds.

Examples of the electron transporting substance include quinone compounds, imide compounds, benzimidazole compounds, cyclopentadienylidene compounds, fluorenone compounds, xanthone compounds, benzophenone compounds, cyanovinyl compounds, halogenated aryl compounds, silole compounds and boron-containing compounds. The undercoat layer may be formed as a cured film by using as the electron transporting substance an electron transporting substance having a polymerizable functional group and copolymerizing the electron transporting substance having a polymerizable functional group with the above-described monomer having a polymerizable functional group.

Examples of the metal oxide include indium tin oxide, tin oxide, indium oxide, titanium oxide, zinc oxide, aluminum oxide, silicon oxide and ammonia-reduced niobium oxide. Examples of the metal include gold, silver and aluminum.

Ammonia-reduced niobium oxide can be a particle represented by the following formula.

(wherein, Nb represents a niobium atom, O represents an oxygen atom, N represents a nitrogen atom and $0.00 < Y < X \leq 4.00$.)

Examples of the electro-conductive polymer include polyaniline, polypyrrole and polythiophene.

The undercoat layer according to the present invention particularly preferably contains a compound represented by the following formula (1) or (2) from the viewpoint of electrical properties. These compounds may be used singly or in combinations of two or more.

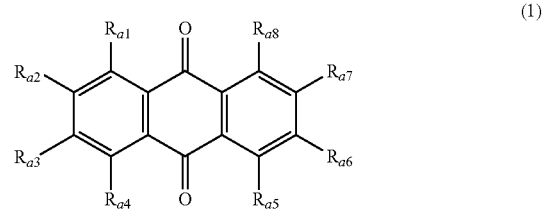

(1)

(wherein, $R_{a1}$ to $R_{a8}$ each independently represent a hydrogen atom, a hydroxy group, a halogen atom, an alkyl group, an alkoxy group, a phenyl group or an amino group.)

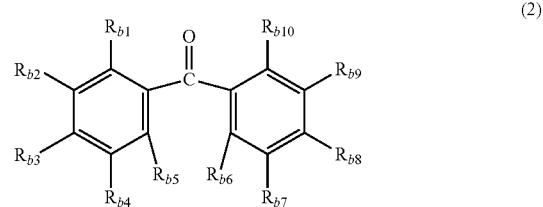

(2)

(wherein, $R_{b1}$ to $R_{b10}$ each independently represent a hydrogen atom, a hydroxy group, a halogen atom, an alkyl group, an alkoxy group, a phenyl group or an amino group.)

The undercoat layer according to the present invention may further contain an organic resin particle and a levelling agent. Examples of the organic resin particle include: hydrophobic organic resin particles such as a silicone particle; and hydrophilic organic resin particles such as a crosslinked type polymethacrylate resin (PMMA) particle.

The average film thickness of the undercoat layer according to the present invention is preferably 0.1 μm or more and 50 μm or less, more preferably 0.2 μm or more and 40 μm or less.

The undercoat layer according to the present invention can be formed in such a way that a coating liquid for an undercoat layer, the coating liquid containing the above described respective materials and a solvent, is prepared, and a coating film of this coating liquid is formed on the support or the electro-conductive layer and is then dried and/or cured. Examples of the solvent to be used for the coating liquid include alcohol-based solvents, ketone-based solvents, ether-based solvents, ester-based solvents and aromatic hydrocarbon-based solvents.

<Photosensitive Layer>

The electrophotographic photosensitive member according to the present invention includes a photosensitive layer on the undercoat layer.

A photosensitive layer of an electrophotographic photosensitive member is mainly classified into (1) a lamination type photosensitive layer and (2) a monolayer type photosensitive layer. (1) The lamination type photosensitive layer includes: a charge generating layer containing a charge generating substance; and a charge transporting layer containing a charge transporting substance. (2) The monolayer type photosensitive layer is a photosensitive layer containing both a charge generating substance and a charge transporting substance.

(1) Lamination Type Photosensitive Layer

The lamination type photosensitive layer includes a charge generating layer and a charge transporting layer.

(1-1) Charge Generating Layer

The charge generating layer can contain a charge generating substance and a resin.

Examples of the charge generating substance include azo pigments, perylene pigments, polycyclic quinone pigments, indigo pigments and phthalocyanine pigments. Among these pigments, azo pigments and phthalocyanine pigments are preferable. Among phthalocyanine pigments, oxytitanium phthalocyanine pigments, chlorogallium phthalocyanine pigments and hydroxy gallium phthalocyanine pigments are preferable.

The content of the charge generating substance in the charge generating layer is preferably 40% by mass or more and 85% by mass or less, more preferably 60% by mass or more and 80% by mass or less based on the total mass of the charge generating layer.

Examples of the resin include polyester resins, polycarbonate resins, polyvinyl acetal resins, polyvinyl butyral resins, acrylic resins, silicone resins, epoxy resins, melamine resins, polyurethane resins, phenolic resins, polyvinyl alcohol resins, cellulose resins, polystyrene resins, polyvinyl acetate resins and polyvinyl chloride resins. Among these resins, polyvinyl butyral resins are far preferable.

In addition, the charge generating layer may further contain an additive or additives such as an antioxidant and an ultraviolet absorber. Specific examples of the additives include hindered phenol compounds, hindered amine compounds, sulfur compounds, phosphorus compounds and benzophenone compounds.

The average film thickness of the charge generating layer is preferably 0.1 µm or more and 1 µm or less, more preferably 0.15 µm or more and 0.4 µm or less.

The charge generating layer can be formed in such a way that a coating liquid for a charge generating layer, the coating liquid containing the above-described respective materials and a solvent, is prepared, and a coating film of this coating liquid is formed on the undercoat layer and is then dried. Examples of the solvent to be used for the coating liquid include alcohol-based solvents, sulfoxide-based solvents, ketone-based solvents, ether-based solvents, ester-based solvents and aromatic hydrocarbon-based solvents.

(1-2) Charge Transporting Layer

The charge transporting layer can contain a charge transporting substance and a resin.

Examples of the charge transporting substance include polycyclic aromatic compounds, heterocyclic compounds, hydrazone compounds, styryl compounds, enamine compounds, benzidine compounds, triarylamine compounds and resins having a group derived from these substances. Among these compounds, triarylamine compounds and benzidine compounds are preferable.

The content of the charge transporting substance in the charge transporting layer is preferably 25% by mass or more and 70% by mass or less, more preferably 30% by mass or more and 55% by mass or less based on the total mass of the charge transporting layer.

Examples of the resin include polyester resins, polycarbonate resins, acrylic resins and polystyrene resins. Among these resins, polycarbonate resins and polyester resins are preferable. As polyester resins, polyarylate resins are particularly preferable.

The content ratio (mass ratio) of the charge transporting substance to the resin is preferably 4:10 to 20:10, more preferably 5:10 to 12:10.

In addition, the charge transporting layer may contain an additive or additives such as antioxidant, an ultraviolet absorber, a plasticizer, a levelling agent, a sliding property-imparting agent and wear resistance-improving agent. Specific examples of the additives include hindered phenol compounds, hindered amine compounds, sulfur compounds, phosphorus compounds, benzophenone compounds, siloxane-modified resins, silicone oils, a fluororesin particle, a polystyrene resin particle, a polyethylene resin particle, a silica particle, an alumina particle and a boron nitride particle.

The average film thickness of the charge transporting layer is preferably 5 µm or more and 50 µm or less, more preferably 8 µm or more and 40 µm or less, and particularly preferably 10 µm or more and 30 µm or less.

The charge transporting layer can be formed in such a way that a coating liquid for a charge transporting layer, the coating liquid containing the above-described respective materials and a solvent, is prepared, and a coating film of this coating liquid is formed on the charge generating layer and is then dried. Examples of the solvent to be used for the coating liquid include alcohol-based solvents, ketone-based solvents, ether-based solvents, ester-based solvents and aromatic hydrocarbon-based solvents. Among these solvents, ether-based solvents or aromatic hydrocarbon-based solvents are preferable.

(2) Monolayer Type Photosensitive Layer

The monolayer type photosensitive layer can be formed in such a way that a coating liquid for a photosensitive layer, the coating liquid containing a charge generating substance, a charge transporting substance, a resin, and a solvent, is prepared, and a coating film of this coating liquid is formed on the undercoat layer and is then dried. Examples of the charge generating substance, the charge transporting substance and the resin are the same as the examples of the materials in the "(1) The Lamination Type Photosensitive Layer".

<Protective Layer>

In the present invention, a protective layer may be provided on the photosensitive layer. When the protective layer is provided, durability can be improved.

The protective layer can contain: an electro-conductive particle and/or a charge transporting substance; and a resin. Examples of the electro-conductive particle include a particle of a metal oxide such as titanium oxide, zinc oxide, tin oxide or indium oxide.

Examples of the charge transporting substance include polycyclic aromatic compounds, heterocyclic compounds, hydrazone compounds, styryl compounds, enamine compounds, benzidine compounds, triarylamine compounds and resins having a group derived from these substances. Among these substances, triarylamine compounds and benzidine compounds are preferable.

Examples of the resin include polyester resins, acrylic resins, phenoxy resins, polycarbonate resins, polystyrene resins, phenolic resins, melamine resins and epoxy resins. Among these resins, polycarbonate resins, polyester resins and acrylic resins are preferable.

In addition, the protective layer may be formed as a cured film by subjecting a composition containing a monomer having a polymerizable functional group to polymerization. Examples of the reaction for the polymerization include a thermal polymerization reaction, a photopolymerization reaction and a radiation polymerization reaction. Examples of the polymerizable functional group of the monomer having a polymerizable functional group include an acrylic group and a methacrylic group. As the monomer having a polymerizable functional group, a material having charge transporting ability may be used.

The protective layer may contain an additive or additives such as an antioxidant, an ultraviolet absorber, a plasticizer, a levelling agent, a sliding property-imparting agent and a wear resistance-improving agent. Specific examples of the additives include hindered phenol compounds, hindered amine compounds, sulfur compounds, phosphorus compounds, benzophenone compounds, siloxane-modified resins, silicone oils, a fluororesin particle, a polystyrene resin particle, a polyethylene resin particle, a silica particle, an alumina particle and a boron nitride particle.

The average film thickness of the protective layer is preferably 0.5 µm or more and 10 µm or less, preferably 1 µm or more and 7 µm or less.

The protective layer can be formed in such a way that a coating liquid for a protective layer, the coating liquid containing the above-described respective materials and a solvent, is prepared, and a coating film of this coating liquid is formed on the photosensitive layer and is then dried and/or cured. Examples of the solvent to be used for the coating liquid include alcohol-based solvents, ketone-based solvents, ether-based solvents, sulfoxide-based solvents, ester-based solvents and aromatic hydrocarbon-based solvents.

<Surface Processing of Electrophotographic Photosensitive Member>

With respect to the electrophotographic photosensitive member according to the present invention, roughness can be imparted by providing concave portions or convex portions on the surface layer of the electrophotographic photosensitive member or by polishing the surface layer for the purpose of further stabilizing the behavior of a cleaning unit (cleaning blade) that is to be brought into contact with the electrophotographic photosensitive member.

In the case where the concave portions are formed, a mold having convex portions corresponding to the concave portions is pressed into contact with the surface of the electrophotographic photosensitive member to perform shape transfer, and the concave portions can be thereby formed on the surface of the electrophotographic photosensitive member.

In the case where the convex portions are formed, a mold having concave portions corresponding to the convex portions is pressed into contact with the surface of the electrophotographic photosensitive member to perform shape transfer, and the convex portions can be thereby formed on the surface of the electrophotographic photosensitive member.

In the case where the roughness is imparted by polishing the surface layer of the electrophotographic photosensitive member, a polishing tool is pressed into contact with the electrophotographic photosensitive member, either one or both of the polishing tool and the electrophotographic photosensitive member are relatively moved to polish the surface of the electrophotographic photosensitive member, and the roughness can be thereby imparted. Examples of the polishing tool include a polishing member provided with a layer on a base material, the layer containing an abrasive grain dispersed in a binder resin.

<Method of Forming Concave Portions on Circumferential Face of Electrophotographic Photosensitive Member>

Concave portions can be formed on the circumferential face of the electrophotographic photosensitive member by pressing a mold having convex portions corresponding to the concave portions to be shaped into contact with the circumferential face of the electrophotographic photosensitive member to perform shape transfer.

Figure 5:
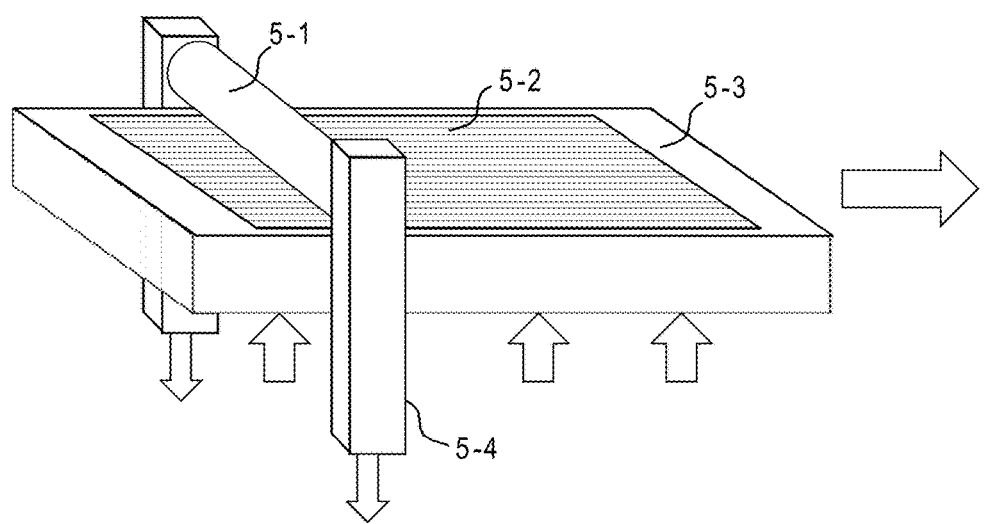
FIG. 5 is a diagram illustrating an example of a press-contact shape transfer processing apparatus for forming concave portions at a circumferential face of an electrophotographic photosensitive member.

FIG. 5 illustrates an example of a press-contact shape transfer processing apparatus for forming concave portions on the circumferential surface of the electrophotographic photosensitive member.

According to the press-contact shape transfer processing apparatus illustrated in FIG. 5, the concave portions and a flat portion can be formed on the circumferential face of the electrophotographic photosensitive member 5-1 by continuously bringing a mold 5-2 into contact with the circumferential face of the electrophotographic photosensitive member 5-1 to apply pressure while the electrophotographic photosensitive member 5-1 is rotated.

Examples of the material of a pressure member 5-3 include metals, metal oxides, plastics and glass. Among these materials, stainless steel (SUS) is preferable from the viewpoint of mechanical strength, dimensional accuracy and durability. A mold 5-2 is installed on the upper face of the pressure member 5-3. In addition, by a support member (not illustrated in figure) and a pressure system (not illustrated in figure), which are installed on the lower face side, the mold 5-2 can be brought into contact at a constant pressure with the circumferential face of the electrophotographic photosensitive member 5-1 supported by a support member 5-4. In addition, the support member 5-4 may be pressed to the pressure member 5-3 at a predetermined pressure, or the support member 5-4 and the pressure member 5-3 are pressed to each other.

FIG. 5 illustrates an example of continuously processing the circumferential face of the electrophotographic photosensitive member 5-1 by moving the pressure member 5-3 in a direction perpendicular to a direction of the shaft of the electrophotographic photosensitive member 5-1 while the electrophotographic photosensitive member 5-1 is allowed to follow the movement or is being driven and rotated. Further, the circumferential face of the electrophotographic photosensitive member 5-1 can also be continuously processed by fixing the pressure member 5-3 and moving the support member 5-4 in a direction perpendicular to the direction of the shaft of the electrophotographic photosensitive member 5-1 or by moving both the support member 5-4 and the pressure member 5-3.

It is to be noted that the mold 5-2 and the electrophotographic photosensitive member 5-1 can be heated from the viewpoint of performing shape transfer efficiently.

Examples of the mold 5-2 include: a mold obtained by patterning, with a resist, the surface of a metal, a resin film, a silicon wafer, or the like on which fine surface processing is applied; and a mold obtained by applying metal coating on a resin film in which a fine particle is dispersed or on a resin film having a fine surface shape.

In addition, an elastic body can be installed between the mold 5-2 and the pressure member 5-3 from the viewpoint of making the pressure to the electrophotographic photosensitive member 5-1 uniform.

The concave portion, flat portion, convex portion and the like on the circumferential face of the electrophotographic photosensitive member can be observed using a microscope such as, for example, a laser microscope, an optical microscope, an electron microscope and an atomic force microscope.

<Polishing Tool for Use in Mechanical Polishing>

With respect to mechanical polishing, publicly known mechanical polishing methods can be utilized. Generally, a polishing tool is brought into contact with the electrophotographic photosensitive member, and either one or both of the electrophotographic photosensitive member and the polishing tool are relatively moved to polish the surface of the electrophotographic photosensitive member. The polishing tool is a polishing member provided with a layer on a base material, the layer containing an abrasive grain dispersed in a binder resin.

Examples of the abrasive grain include a particle of aluminum oxide, chromium oxide, diamond, iron oxide, cerium oxide, corundum, silica stone, silicon nitride, boron nitride, molybdenum carbide, silicon carbide, tungsten carbide, titanium carbide or silicon oxide. The particle diameter of the abrasive grain is preferably 0.01 μm or more and 50 μm or less, more preferably 1 μm or more and 15 μm or less. When the particle diameter of the abrasive grain is too small, the polishing power becomes weak to make an F/C ratio on the outermost surface of the electrophotographic photosensitive member hard to increase. These abrasive grains can be used singly, or two or more of these abrasive grains can be mixed for use. In the case where two or more of these abrasive grains are mixed, the materials and the particle diameters may be the same or different.

As the binder resin for dispersing the abrasive grain to be used for the polishing tool, thermoplastic resins, thermosetting resins, reactive type resins, electron beam curable resins, ultraviolet curable resins, visible light curable resins and antifungal resins which are publicly known can be used. Examples of the thermoplastic resins include vinyl chloride resins, polyamide resins, polyester resins, polycarbonate resins, amino resins, styrene-butadiene copolymers, urethane elastomers and polyamide-silicone resins. Examples of the thermosetting resins include phenolic resins, phenoxy resins, epoxy resins, polyurethane resins, polyester resins, silicone resins, melamine resins and alkyd resins. In addition, isocyanate-based curing agents can be added to the thermoplastic resins.

The film thickness of the layer of the polishing tool, the layer containing an abrasive grain dispersed in a binder resin, can be 1 μm or more and 100 μm or less. When the film thickness is too thick, unevenness in the film thickness is liable to occur and as a result, unevenness in the surface roughness of a body to be polished becomes a problem. On the other hand, when the film thickness is too thin, dropping-out of the abrasive grain is liable to occur.

The shape of the base material of the polishing tool is not particularly limited. In the embodiment of the present example, a sheet-like base material is used to polish the cylindrical electrophotographic photosensitive member efficiently; however, other shapes may be used. Further, the material of the base material of the polishing tool (hereinafter, also described as polishing sheet of the present example) is not particularly limited. Examples of the material of the sheet-like base material include paper, nonwoven fabric, woven fabric and a plastic film.

The polishing tool can be obtained by coating the base material with a coating liquid in which the above described abrasive grain and binder resin, and a solvent that can solve the binder resin are mixed and dispersed, and then drying the coating material on the base material.

<Polishing Apparatus>

Figure 3:
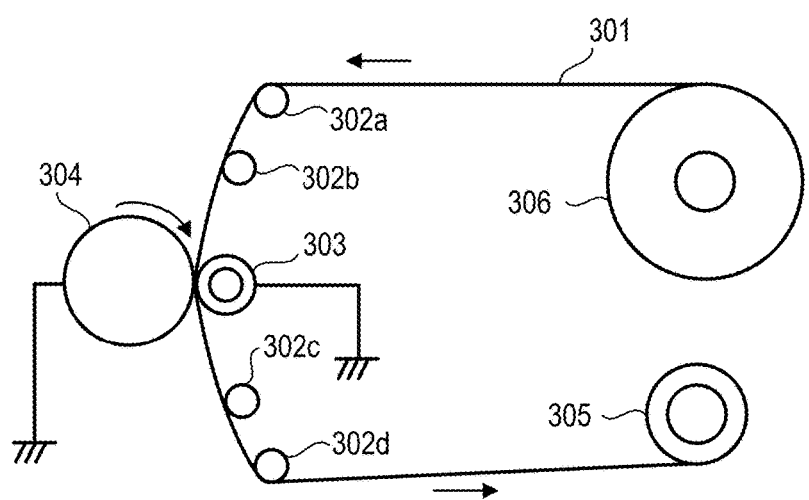
FIG. 3 is a diagram illustrating an example of a polishing machine using a polishing sheet.

FIG. 3 illustrates an example of a polishing apparatus for the electrophotographic photosensitive member of the present example.

FIG. 3 illustrates an apparatus for polishing a cylindrical electrophotographic photosensitive member using a polishing sheet. In FIG. 3, a polishing sheet 301 is wound onto a hollow shaft 306, and a motor (not illustrated in figure) is disposed so that tension can be given to the polishing sheet 301 in the direction opposite to the direction in which the polishing sheet 301 is fed toward the shaft 306. The polishing sheet 301 is fed in the direction of the arrow and passes through a backup roller 303 via guide rollers 302a, 302b, and the polishing sheet 301 after being polished is wound onto a winding unit 305 via guide rollers 302c, 302d by a motor (not illustrated in figure). Polishing is performed in a state where the polishing sheet 301 is pressed into contact with a body to be processed (electrophotographic photosensitive member before performing polishing) 304 at all times. Many of the polishing sheets 301 have electrical insulation properties and therefore a substance connected to the ground by earth or a substance having electro-conductivity may be used at a position where the substance comes into contact with the polishing sheet 301.

The feeding speed of the polishing sheet 301 can be 10 mm/min or more and 1000 mm/min or less. When the amount of the polishing sheet to be fed is small, adhesion of the binder resin to the surface of the polishing sheet 301, or a deep wound attributable to the adhesion of the binder resin may occur on the surface of the body to be processed 304.

The body to be processed 304 is placed at a position opposite to the backup roller 303 with the polishing sheet 301 interposed therebetween. The backup roller 303 can be an elastic body from the viewpoint of improving the uniformity of the surface roughness of the body to be processed 304. In such a constitution, the body to be processed 304 and the backup roller 303 are pressed to each other with the polishing sheet 301 interposed therebetween at a desired set value for a predetermined time, and the surface of the body to be processed 304 are thereby polished. The direction of rotation of the body to be processed 304 may be the same as or opposite to the direction in which the polishing sheet 301 is fed. In addition, the direction of rotation may be changed in the middle of polishing.

The pressure in pressing the backup roller 303 to the body to be processed 304 can be 0.005 N/m$^2$ or more and 15 N/m$^2$ or less although the pressure depends on the hardness of the backup roller 303 and the polishing time.

The surface roughness of the electrophotographic photosensitive member can be adjusted by appropriately selecting the feeding speed of the polishing sheet 301, the pressure of pressing the backup roller 303, the type of the abrasive grain of the polishing sheet, the film thickness of the binder resin and the thickness of the base material of the polishing sheet, and the like.

[Process Cartridge and Electrophotographic Apparatus]

A process cartridge according to the present invention integrally supports: an electrophotographic photosensitive member described above; and at least one unit selected from the group consisting of a charging unit, a developing unit, a transfer unit and a cleaning unit and is detachably attachable to an electrophotographic apparatus main body.

In addition, an electrophotographic apparatus according to the present invention includes: an electrophotographic photosensitive member described above; a charging unit; an exposing unit; a developing unit; and a transfer unit.

Moreover, the electrophotographic photosensitive member according to the present invention includes as the charging unit: a charging roller disposed on the electrophotographic photosensitive member described above so as to be in contact with the electrophotographic photosensitive member; and a unit that charges the electrophotographic photosensitive member by applying only direct-current voltage to the charging roller.

Figure 2:
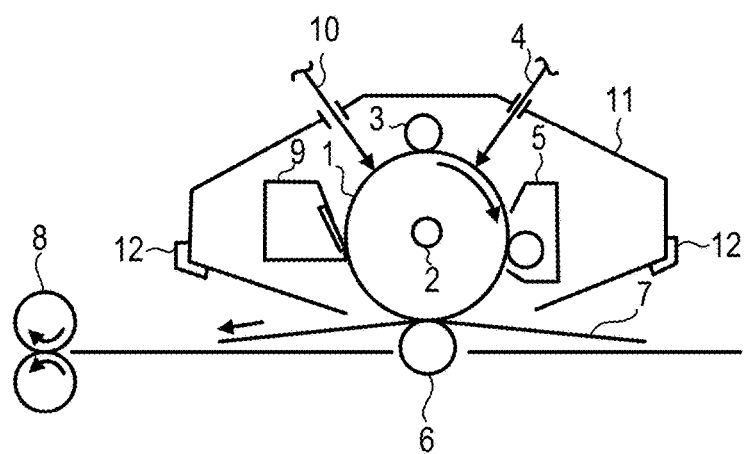
FIG. 2 is a diagram illustrating an example of an electrophotographic apparatus provided with a process cartridge including an electrophotographic photosensitive member according to the present invention.

FIG. 2 illustrates an example of an outline constitution of an electrophotographic apparatus including a process cartridge provided with an electrophotographic photosensitive member.

Reference numeral 1 denotes a cylindrical electrophotographic photosensitive member and is rotationally driven around a shaft 2 in the direction of the arrow at a predetermined circumferential speed. The surface of the electrophotographic photosensitive member 1 is charged at a predetermined positive or negative potential by a charging unit 3. It is to be noted that the figure illustrates a roller charging system using a roller type charging member; however, a charging system such as a corona charging system, a proximity charging system or an injection charging system may be adopted. In the case of the roller charging system, there exist a DC charging system in which voltage to be applied to a roller type charging member is only direct-current voltage and an AC/DC charging system in which alternating-current voltage is superposed on direct-current voltage; however, the charging system can be the DC charging system from the viewpoint of reducing apparatus cost and miniaturizing an apparatus. The surface of the charged electrophotographic photosensitive member 1 is irradiated with exposing light 4 from an exposing unit (not illustrated in figure) and an electrostatic latent image corresponding to the intended image information is formed. The electrostatic latent image formed on the surface of the electrophotographic photosensitive member 1 is developed by a toner stored in a developing unit 5 and a toner image is formed on the surface of the electrophotographic photosensitive member 1. The toner image formed on the surface of the electrophotographic photosensitive member 1 is transferred to a transfer material 7 by a transfer unit 6. The transfer material 7 to which the toner image has been transferred is conveyed to a fixing unit 8 where the transfer material 7 is subjected to a treatment for fixing the toner image, and the transfer material 7 is then printed out outside the electrophotographic apparatus. The electrophotographic apparatus may include a cleaning unit 9 for removing deposits such as a toner left on the surface of the electrophotographic photosensitive member 1 after the transfer of the toner image. In addition, a so-called cleanerless system in which a cleaning unit is not provided separately and the deposits are removed by the developing unit or the like may be used. The electrophotographic apparatus may include an electricity removing mechanism that performs an electricity removing treatment on the surface of the electrophotographic photosensitive member 1 by pre-exposing light 10 from a pre-exposing unit (not illustrated in figure). Moreover, a guide unit 12 such as a rail may be provided for attachment/detachment of the process cartridge 11 according to the present invention to/from the electrophotographic apparatus main body.

The electrophotographic photosensitive member according to the present invention can be used for a laser beam printer, an LED printer, a copying machine, facsimile equipment and a multifunctional machine thereof, and the like.

EXAMPLES

Hereinafter, the present invention will be described in more detail using Examples and Comparative Examples. The present invention is not limited by the following Examples within a range not exceeding the scope of the present invention. It is to be noted that "parts" in the description of Examples below are each on a mass basis unless otherwise noted.

[Method for Producing Strontium Titanate Particle]

<Production Example for Particle S-1>

A water-containing titanium oxide slurry obtained by subjecting a titanyl sulfate aqueous solution to hydrolysis was washed with an alkaline solution.

Subsequently, hydrochloric acid was added to the water-containing titanium oxide slurry to adjust the pH to 0.7, and thus a titania sol dispersion liquid was obtained.

To 2.2 mol (in terms of titanium oxide) of the titania sol dispersion liquid, a strontium chloride aqueous solution in a molar quantity of 1.1 times the molar quantity of the titania sol dispersion liquid was added. A resultant mixture was put into a reaction vessel and the air inside the vessel was replaced with a nitrogen gas.

Further, pure water was added to the mixture so that a resultant mixture has a concentration of 1.1 mol/L in terms of titanium oxide.

Subsequently, the mixture was stirred and mixed, and was warmed to 90° C. Thereafter, 440 mL of a 10 N sodium hydroxide aqueous solution was added to the mixture over 15 minutes while ultrasonic vibration was applied to the mixture, and the reaction was then performed for 20 minutes.

To a slurry after the reaction, pure water of 5° C. was added to quench the slurry until the temperature reached 30° C. or lower, and the supernatant liquid was then removed.

Further, a hydrochloric acid aqueous solution having a pH of 5.0 was added to the slurry and a resultant mixture was stirred for 1 hour. Thereafter, washing with pure water was repeated. Further, the mixture was neutralized with sodium hydroxide to perform filtration with a Nutsche funnel, and a residue was washed with pure water. Obtained cake was dried to obtain a particle S-1.

<Production Example for Particle S-2>

To 2.6 mol (in terms of titanium oxide) of the titania sol dispersion liquid, a strontium chloride aqueous solution in a molar quantity of 1.0 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 1.3 mol/L.

Subsequently, the mixture was stirred and mixed, and was warmed to 95° C. Thereafter, 300 mL of a 15 N sodium hydroxide aqueous solution was added to the mixture over 5 minutes while ultrasonic vibration was applied to the mixture, and the reaction was then performed for 20 minutes. To a slurry after the reaction, pure water of 5° C. was added to quench the slurry until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Further, the mixture was neutralized with sodium hydroxide to perform filtration with a Nutsche funnel, and a residue was washed with pure water. Obtained cake was dried to obtain a particle S-2.

<Production Example for Particle S-3>

To 2.0 mol (in terms of titanium oxide) of the titania sol dispersion liquid, a strontium chloride aqueous solution in a molar quantity of 1.1 times the molar quantity of the titania sol dispersion liquid was added. A resultant mixture was put into a reaction vessel and the air inside the vessel was replaced with a nitrogen gas. Further, pure water was added to the mixture so that the resultant mixture has a titanium oxide concentration of 1.0 mol/L.

Subsequently, the mixture was stirred and mixed, and was warmed to 85° C. Thereafter, 800 mL of a 5 N sodium hydroxide aqueous solution was added to the mixture over 20 minutes while ultrasonic vibration was applied to the mixture, and the reaction was then performed for 20 minutes. To a slurry after the reaction, pure water of 5° C. was added to quench the slurry until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Further, the mixture was neutralized with sodium hydroxide to perform filtration with a Nutsche funnel, and residue was washed with pure water. Obtained cake was dried to obtain a particle S-3.

<Production Example for Particle S-4>

To 1.8 mol (in terms of titanium oxide) of the titania sol dispersion liquid, a strontium chloride aqueous solution in a molar quantity of 1.1 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.9 mol/L.

Subsequently, the mixture was stirred and mixed, and was warmed to 85° C. Thereafter, 576 mL of a 5 N sodium hydroxide aqueous solution was added to the mixture over 5 minutes while ultrasonic vibration was applied to the mixture, and the reaction was then performed for 20 minutes. To a slurry after the reaction, pure water of 5° C. was added to quench the slurry until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Further, the mixture was neutralized with sodium hydroxide to perform filtration with a Nutsche funnel, and a residue was washed with pure water. Obtained cake was dried to obtain a particle S-4.

<Production Example for Particle S-5>

To 1.8 mol (in terms of titanium oxide) of the titania sol dispersion liquid, a strontium chloride aqueous solution in a molar quantity of 1.1 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.9 mol/L.

Subsequently, the mixture was stirred and mixed, and was warmed to 80° C. Thereafter, 792 mL of a 5 N sodium hydroxide aqueous solution was added to the mixture over 40 minutes while ultrasonic vibration was applied to the mixture, and the reaction was then performed for 20 minutes. A slurry after the reaction was quenched until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Further, the mixture was neutralized with sodium hydroxide to perform filtration with a Nutsche funnel, and a residue was washed with pure water. Obtained cake was dried to obtain a particle S-5.

<Production Example for Particle S-6>

To 1.4 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.7 mol/L.

Subsequently, the mixture was stirred and mixed, and was warmed to 80° C. Thereafter, 1100 mL of a 3 N sodium hydroxide aqueous solution was added to the mixture over 40 minutes while ultrasonic vibration was applied to the mixture, and the reaction was then performed for 20 minutes. A slurry after the reaction was quenched until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Obtained cake was dried to obtain a particle S-6.

<Production Example for Particle S-7>

To 1.0 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.5 mol/L.

Subsequently, the mixture was stirred and mixed, and was warmed to 70° C. Thereafter, 1100 mL of a 2 N sodium hydroxide aqueous solution was added to the mixture over 40 minutes while ultrasonic vibration was applied to the mixture, and the reaction was then performed for 20 minutes. A slurry after the reaction was quenched until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, washing with pure water was repeated. Obtained cake was dried to obtain a particle S-7.

<Production Example for Particle S-8>

To 1.0 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.5 mol/L.

Subsequently, the mixture was stirred and mixed, and was warmed to 70° C. Thereafter, 1200 mL of a 2 N sodium hydroxide aqueous solution was added to the mixture over 240 minutes, and the reaction was then performed for 60 minutes. A slurry after the reaction was quenched until the temperature reached 30° C. or lower, and the supernatant liquid was then removed. Further, a hydrochloric acid aqueous solution having a pH of 5.0 was added to the slurry and a resultant mixture was stirred for 1 hour. Thereafter, the mixture was washed with pure water and then dried to obtain a particle S. The half-value width of the particle S was 0.15. Further, the particle S was put into an automatic discharge ball mill (manufactured by EISHIN Co., Ltd.) together with an alumina ball of 4 mm and was stirred for 200 hours. Thereafter, removal of the alumina ball and washing were performed to obtain a particle S-8.

<Production Example for Particle S-9>

To 0.6 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.3 mol/L.

Subsequently, the mixture was stirred and mixed, and was warmed to 80° C. Thereafter, 750 mL of a 2 N sodium hydroxide aqueous solution was added to the mixture over 480 minutes, and the reaction was then performed for 20 minutes. A slurry after the reaction was quenched until the temperature reached 30° C. or lower, and the supernatant liquid was then removed. Further, the slurry was washed with pure water and obtained cake was dried to obtain a particle S-9.

<Production Example for Particle S-10>

To 0.6 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, 0.05 mol of aluminum sulfate was added to the mixture and pure water was then added so that the resultant mixture has a titanium oxide concentration of 0.3 mol/L.

Subsequently, the mixture was stirred and mixed, and was warmed to 80° C. Thereafter, 450 mL of a 2 N sodium hydroxide aqueous solution was added to the mixture over 5 minutes while ultrasonic vibration was applied to the mixture, and the reaction was then performed for 20 minutes. To a slurry after the reaction, pure water of 5° C. was added to quench the slurry until the temperature reached 30° C. or lower, and the supernatant liquid was then removed. Further, the slurry was washed with pure water and obtained cake was dried to obtain a particle S-10.

<Production Example for Particle S-11>

To 0.6 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.3 mol/L.

Subsequently, the mixture was stirred and mixed, and was warmed to 80° C. Thereafter, 750 mL of a 2 N sodium hydroxide aqueous solution was added to the mixture over 540 minutes, and the reaction was then performed for 20 minutes. A slurry after the reaction was quenched until the temperature reached 30° C. or lower, and the supernatant liquid was then removed. Further, the slurry was washed with pure water and obtained cake was dried to obtain a particle S-11.

<Production Example for Particle S-12>

To 0.4 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.2 mol/L.

Subsequently, the mixture was stirred and mixed, and was warmed to 70° C. Thereafter, 600 mL of a 2 N sodium hydroxide aqueous solution was added to the mixture over 660 minutes, and the reaction was then performed for 20 minutes. A slurry after the reaction was quenched until the temperature reached 30° C. or lower, and the supernatant liquid was then removed. Further, the slurry was washed with pure water and obtained cake was dried to obtain a particle S-12.

<Production Example for Particle S-13>

To 0.6 mol (in terms of titanium oxide) of the titania sol dispersion liquid, a strontium chloride aqueous solution in a molar quantity of 1.2 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.3 mol/L.

Subsequently, the mixture was stirred and mixed, and was warmed to 80° C. Thereafter, 750 mL of a 2 N sodium hydroxide aqueous solution was added to the mixture over 600 minutes, and the reaction was then performed for 20 minutes. A slurry after the reaction was quenched until the temperature reached 30° C. or lower, and the supernatant liquid was then removed. Further, the slurry was washed with pure water and obtained cake was dried to obtain a particle S-13.

<Production Example for Particle S-14>

To 0.6 mol (in terms of titanium oxide) of the titania sol dispersion liquid, a strontium chloride aqueous solution in a molar quantity of 1.3 times the molar quantity of the titania sol dispersion liquid was added. A resultant mixture was put into a reaction vessel and the air inside the vessel was replaced with a nitrogen gas. Further, pure water was added to the mixture so that a resultant mixture has a titanium oxide concentration of 0.1 mol/L.

Subsequently, the mixture was stirred and mixed, and was warmed to 70° C. Thereafter, 750 mL of a 2 N sodium hydroxide aqueous solution was added to the mixture over 900 minutes, and the reaction was then performed for 20 minutes. A slurry after the reaction was quenched until the temperature reached 30° C. or lower, and the supernatant liquid was then removed. Further, the slurry was washed with pure water and obtained cake was dried to obtain a particle S-14.

<X-Ray Diffraction Measurement of Particles>

X-ray diffraction measurement of the produced particles S-1 to S-14 was conducted using MiniFlex600 (manufactured by Rigaku Corporation) under the following conditions.

Each measurement sample was put on a reflection free sample holder (manufactured by Rigaku Corporation) not having a diffraction peak in the measurement range while lightly pressing the sample in the form of a powder as it is. When the sample became flat, the sample was set into the apparatus together with the sample holder to conduct measurement.

[Measurement Conditions of X-ray Diffraction]

Tube bulb: Cu

Parallel beam optical system

Voltage: 40 kV

Current: 15 mA
Start angle: 3°
End angle: 60°
Sampling width: 0.02°
Scanning speed: 10.00°/min
Divergence slit: 0.625 deg
Scattering slit: 8.0 mm
Light receiving slit: 13.0 mm (Open)

In the X-ray diffraction patterns obtained by the measurement, the half-value widths were calculated for the peaks that appeared at a position of $2\theta=32.20\pm0.20$ ($\theta$ represents a Bragg angle). The calculation of the half-value widths was conducted using analysis software "PDXL" produced by Rigaku Corporation. The results are shown in Table 1.

<Measurement of Average Particle Diameter of Primary Particles>

With respect to the average particle diameter (number average particle diameter) of the primary particles for the produced particles S-1 to S-14, observation was conducted using a transmission electron microscope "H-800" (manufactured by Hitachi, Ltd.) and major axes of 100 primary particles were measured in a visual field enlarged up to a maximum of 2000000 magnifications to determine the average particle diameter of the primary particles. The results are shown in Table 1.

TABLE 1

| Strontium titanate particle | Half-value width [deg] | Number average particle diameter of primary particles [nm] |
|---|---|---|
| Particle S-1 | 0.33 | 35 |
| Particle S-2 | 0.40 | 10 |
| Particle S-3 | 0.28 | 50 |
| Particle S-4 | 0.50 | 50 |
| Particle S-5 | 0.23 | 50 |
| Particle S-6 | 0.23 | 70 |
| Particle S-7 | 0.23 | 95 |
| Particle S-8 | 0.23 | 95 |
| Particle S-9 | 0.18 | 100 |
| Particle S-10 | 0.55 | 110 |
| Particle S-11 | 0.15 | 110 |
| Particle S-12 | 0.10 | 150 |
| Particle S-13 | 0.08 | 110 |
| Particle S-14 | 0.15 | 200 |

[Production Examples for Surface-Treated Strontium Titanate Particle]

<Production Example of Surface-Treated Particle S-1A>

With 500 parts of toluene, 100 parts of the produced particle S-1 was stirred and mixed, and 2 parts of N-2-(aminoethyl)-3-aminopropylmethyldimethoxysilane (trade name: KBM602, manufactured by Shin-Etsu Chemical Co., Ltd.) was added as a silane coupling agent thereto and a resultant mixture was stirred for 6 hours. Thereafter, toluene was distilled away under reduced pressure and a residue was dried by heating at 130° C. for 6 hours to obtain a surface-treated particle S-1A.

<Production Example for Surface-Treated Particle S-1B>

A surface-treated particle S-1B was produced in the same manner as in Production Example for the particle S-1A except that the amount of the silane coupling agent added was changed to 0.75 parts in Production Example for Surface-Treated Particle S-1A.

<Production Example for Surface-Treated Particle S-1C>

A surface-treated particle S-1C was produced in the same manner as in Production Example for the particle S-1A except that the amount of the silane coupling agent added was changed to 5 parts in Production Example for Surface-Treated Particle S-1A.

<Production Example for Surface-Treated Particle S-1D>

A surface-treated particle S-1D was produced in the same manner as in Production Example for the particle S-1A except that the silane coupling agent was changed to N-2-(aminoethyl)-3-aminopropyltrimethoxysilane (trade name: KBM603, manufactured by Shin-Etsu Chemical Co., Ltd.) in Production Example for Surface-Treated Particle S-1A.

<Production Example for Surface-Treated Particle S-1E>

A surface-treated particle S-1E was produced in the same manner as in Production Example for the particle S-1A except that the silane coupling agent was changed to isobutyltrimethoxysilane (trade name: Z-2306, manufactured by Dow Corning Toray Co., Ltd.) in Production Example for Surface-Treated Particle S-1A.

<Production Example for Surface-Treated Particle S-1F>

A surface-treated particle S-1F was produced in the same manner as in Production Example for the particle S-1A except that the silane coupling agent was changed to trifluoropropylmethoxysilane (trade name: KBM-7103, manufactured by Shin-Etsu Chemical Co., Ltd.) in Production Example for Surface-Treated Particle S-1A.

<Production Example for Surface-Treated Particle S-1G>

A surface-treated particle S-1G was produced in the same manner as in Production Example for the particle S-1A except that the silane coupling agent was changed to 4.6 parts of isobutyltrimethoxysilane and 4.6 parts of trifluoropropylmethoxysilane in Production Example for Surface-Treated Particle S-1A.

<Production Examples for Surface-Treated Particles S-2A to S-14A>

Surface-treated particles S-2A to S-14A were produced in the same manner as in Production Example for the particle S-1A except that the particle S-1 was changed to the particles S-2 to S-14 in Production Example for Surface-Treated Particle S-1A.

Example A1

An aluminum cylinder having a length of 357.5 mm, a thickness of 0.7 mm and an outer diameter of 30 mm was prepared as a support (electro-conductive support). Cut processing was performed on the surface of the prepared aluminum cylinder using a lathe.

Processing was performed under conditions of using a cutting tool of R0.1 at a number of revolutions of the main shaft=10000 rpm and continuously changing the feeding speed of the cutting tool in the range of 0.03 to 0.06 mm/rpm.

Subsequently, 15 parts of a butyral resin (trade name: BM-1, manufactured by Sekisui Chemical Co., Ltd.) as a polyol resin and 15 parts of blocked isocyanate (trade name: Sumidule 3175, manufactured by Sumika Bayer Urethane Co., Ltd.) were dissolved in a mixed liquid of 300 parts of methyl ethyl ketone and 300 parts of 1-butanol.

To the solution, 120 parts of the particle S-1A as a strontium titanate particle and 1.2 parts of 2,3,4-trihydroxybenzophenone (manufactured by Tokyo Chemical Industry Co., Ltd.) as an additive were added, and a resultant mixture was dispersed with a sand mill apparatus which uses a glass bead having a diameter of 0.8 mm under an atmosphere of 23±3° C. for 3 hours.

After the dispersion, 0.01 parts of a silicone oil (trade name: SH 28 PA, manufactured by Dow Corning Toray Co., Ltd.) was added to the dispersion liquid and a resultant mixture was stirred to prepare a coating liquid for an undercoat layer.

The support was dip-coated with the obtained coating liquid for an undercoat layer and was dried at 160° C. for 30 minutes to form an undercoat layer having a film thickness of 2.0 μm.

Subsequently, in a sand mill which uses a glass bead having a diameter of 1 mm, 20 parts of a hydroxy gallium phthalocyanine crystal (charge generating substance) of a crystal form having strong peaks at a Bragg angle 2θ±0.2° of 7.4° and of 28.2° in CuKα characteristic X-ray diffraction, 0.2 parts of the calixarene compound represented by the following formula (A), 10 parts of a polyvinyl butyral resin (trade name: S-LEC BX-1, manufactured by Sekisui Chemical Co., Ltd.) and 600 parts of cyclohexanone were placed and were subjected to a dispersion treatment for 4 hours. Thereafter, 600 parts of ethyl acetate was added thereto to prepare a coating liquid for a charge generating layer.

The undercoat layer was dip-coated with the coating liquid for a charge generating layer and a coating film obtained was dried at 80° C. for 15 minutes to form a charge generating layer having a film thickness of 0.19 μm.

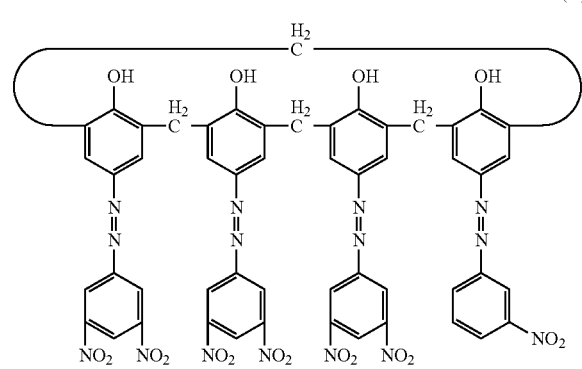

(A)

Subsequently, 60 parts of the compound (charge transporting substance) represented by the following formula (B), 30 parts of the compound (charge transporting substance) represented by the following formula (C), 10 parts of the compound represented by the following formula (D), 100 parts of a polycarbonate resin (trade name: Iupilon Z400, manufactured by Mitsubishi Engineering-Plastics Corporation, bisphenol Z type polycarbonate) and 0.02 parts of the polycarbonate represented by the following formula (E) (viscosity average molecular weight Mv: 20000) were dissolved in a mixed solvent of 600 parts of o-xylene and 200 parts of dimethoxymethane to prepare a coating liquid for a charge transporting layer.

The charge generating layer was dip-coated with the coating liquid for a charge transporting layer to form a coating film and the obtained coating film was dried at 100° C. for 30 minutes to form a charge transporting layer having a film thickness of 18 μm.

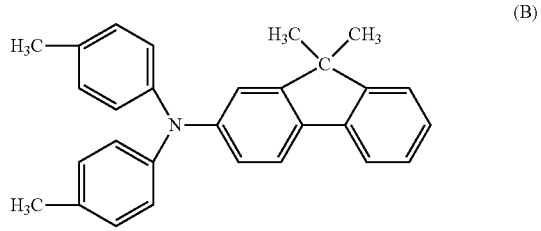

(B)

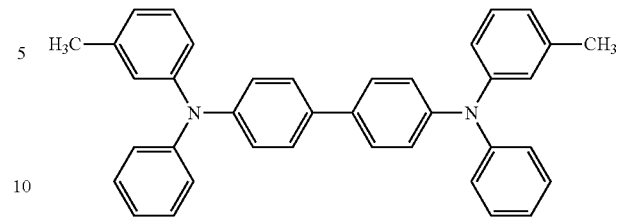

(C)

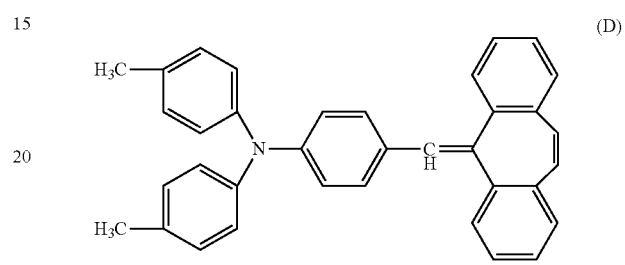

(D)

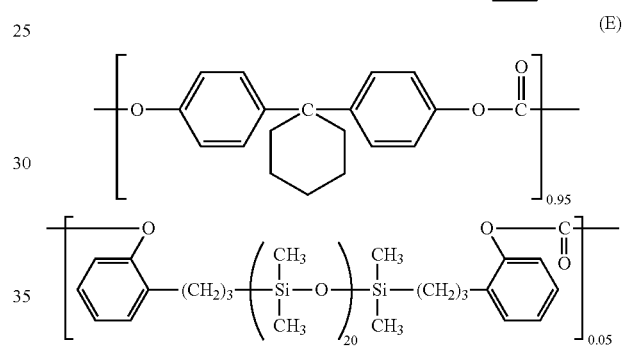

(E)

Subsequently, 1.65 parts of a resin having the repeating structural unit represented by the following formula (M1) and the repeating structural unit represented by the following formula (M2) (weight average molecular weight: 130,000, copolymerization ratio (M1)/(M2)=1/1 (molar ratio)) was dissolved in a mixed solvent of 40 parts of 1,1,2,2,3,3,4-heptafluorocyclopentane (trade name: ZEORORA H, manufactured by Zeon Corporation) and 55 parts of 1-propanol. Thereafter, a liquid obtained by adding to a resultant solution 30 parts of a tetrafluoroethylene resin powder (trade name: Lubron L-2, manufactured by Daikin Industries, Ltd.) was allowed to pass through a high-pressure disperser (trade name: Microfluidizer M-110EH, manufactured by Microfluidics Corp.) to obtain a dispersion liquid.

Thereafter, 52.0 parts of the positive hole transporting compound represented by the following formula (F), 16.0 parts of the compound represented by the following formula (G) (ARONIX M-315, manufactured by Toagosei Co., Ltd.), 2.0 parts of the compound represented by the following formula (H) (manufactured by Sigma-Aldrich Co. LLC), 0.75 parts of a siloxane-modified acrylic compound (BYK-3550, manufactured by BYK Japan KK), 35 parts of 1,1,2,2,3,3,4-heptafluorocyclopentane and 15 parts of 1-propanol were added to the dispersion liquid and a resultant liquid was filtrated with a polyflon filter (trade name: PF-040, manufactured by Advantec Toyo Kaisha, Ltd.) to prepare a coating liquid for a protective layer.

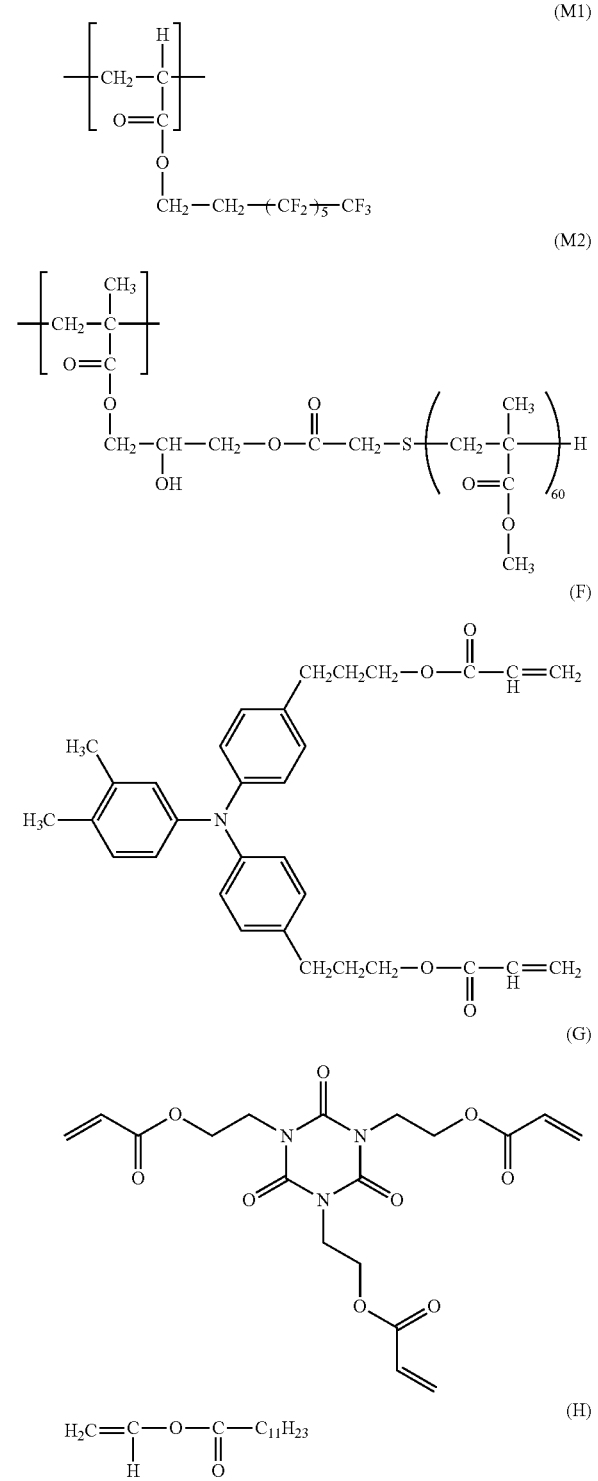

The charge transporting layer was dip-coated with the coating liquid for a protective layer and an obtained coating film was dried at 40° C. for 5 minutes. After the drying, the coating film was irradiated with an electron beam for 1.6 seconds under a nitrogen atmosphere under conditions of an acceleration voltage of 70 KV and an absorbed dose of 15 kGy. Thereafter, a heat treatment was performed for 15 seconds under a nitrogen atmosphere under conditions for making the temperature of the coating film 135° C. It is to be noted that the oxygen concentration from the irradiation with the electron beam to the heat treatment of 15 seconds was 15 ppm. Subsequently, a heat treatment was performed in the air for 1 hour under conditions for making the temperature of the coating film 105° C. to form a protective layer having a film thickness of 5 μm. In this way, an electrophotographic photosensitive member before the formation of concave portions was prepared.

[Formation of Concave Portions through Mold Press-Contact Shape Transfer]

Subsequently, a mold member (mold) is installed in a press-contact shape transfer processing apparatus and surface processing was performed on the prepared electrophotographic photosensitive member before the formation of concave portions.

Figure 4A:
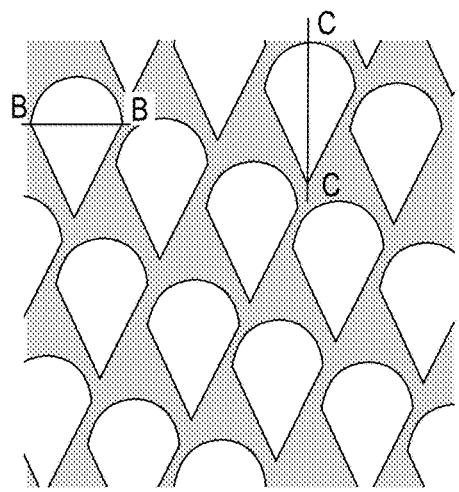
FIG. 4A is a top view illustrating a mold used in Production Examples of an electrophotographic photosensitive member.
Figure 4B:
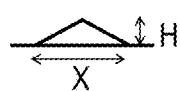
FIG. 4B is a B-B sectional view of convex portions of the mold illustrated in FIG. 4A.
Figure 4C:
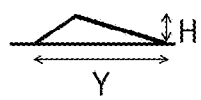
FIG. 4C is a C-C sectional view of convex portions of the mold illustrated in FIG. 4A.

Specifically, a mold illustrated in FIG. 4A, FIG. 4B and FIG. 4C was installed in a press-contact shape transfer processing apparatus having a constitution as roughly illustrated in FIG. 5 and surface processing was performed on the prepared electrophotographic photosensitive member before the formation of concave portions. FIG. 4A, FIG. 4B and FIG. 4C are diagrams illustrating the mold used in Examples and Comparative Examples. FIG. 4A is a top view illustrating the outline of the mold and FIG. 4B is a schematic sectional view of the convex portions of the mold in the direction of the shaft of the electrophotographic photosensitive member (sectional view in B-B section in FIG. 4A). FIG. 4C is a sectional view of the convex portions of the mold in the direction of the circumference of the electrophotographic photosensitive member (sectional view in C-C section in FIG. 4A). The mold illustrated in FIG. 4A, FIG. 4B and FIG. 4C has convex shapes having a maximum width (refers to the maximum width in the direction of the shaft of the electrophotographic photosensitive member when a convex portion on the mold is viewed from above) X: 50 μm, a maximum length (refers to the maximum length in the direction of the circumference of the electrophotographic photosensitive member when a convex portion on the mold is viewed from above) Y: 75 μm, an area ratio of 56% and a height H: 4 μm. It is to be noted that the area ratio refers to a ratio of the area of the convex portions in the whole surface when the mold is viewed from above. During processing, the temperatures of the electrophotographic photosensitive member and the mold were controlled so that the temperature of the surface of the electrophotographic photosensitive member was 120° C. The electrophotographic photosensitive member was rotated in the circumferential direction while the electrophotographic photosensitive member and the pressure member were pressed to the mold at a pressure of 7.0 MPa, and the concave portions were thereby formed on the whole surface of the surface layer (circumferential face) of the electrophotographic photosensitive member.

Two electrophotographic photosensitive members of Example A1 were prepared, one for evaluation of electrical properties and one for X-ray diffraction measurement, in the manner as described above.

[Evaluation of Electrophotographic Photosensitive Member]

<Evaluation 1 of Electrical Properties of Electrophotographic Photosensitive Member>

As an evaluation 1 of electrical properties of electrophotographic photosensitive member, a modified machine of an electrophotographic apparatus imageRUNNER ADVANCE C3330 manufactured by Canon Inc. was used. Evaluation was conducted using as a charging unit a system of applying direct-current voltage to a roller type contact charging member (charging roller).

The evaluation apparatus was installed under an environment of a temperature of 23° C. and a relative humidity of 50% RH. Measurement of the surface potential of the electrophotographic photosensitive member was conducted by taking out a developing cartridge from the evaluation apparatus and inserting a potential measurement apparatus therein. The potential measurement apparatus is configured by disposing a potential measurement probe at a developing position of the developing cartridge and the position of the potential measurement probe was at the center of the electrophotographic photosensitive member in the bus line.

The surface potential (dark part potential) Vd1 of the electrophotographic photosensitive member when the direct voltage −1500 V was applied to the charging member (charging roller) was evaluated as evaluation of a charging characteristic. The results are shown in Table 2.

The charging characteristic was evaluated as rank A when the absolute value of the dark part potential Vd1, |Vd1| measured under the above-described evaluation conditions is 750 V or more, as rank B when 700 V or more, as rank C when 650 V or more and as rank D when less than 650 V.

Next, the voltage applied to the charging member (charging roller) was adjusted so that the dark potential Vd1 was −700 V. The laser light quantity was adjusted so that bright part potential Vl1 was −200 V when irradiation with laser light having a wavelength of 780 nm was performed and residual potential Vr1 was evaluated after 10 sheets of a solid black image were printed out. The results are shown in Table 2.

The residual potential was evaluated as rank A when the absolute value of the residual potential Vr1, |Vr1|, measured under the above-described conditions is 70 V or less, as rank B when 100 V or less and as rank C when larger than 100 V.

<X-Ray Diffraction Measurement of Undercoat Layer>

Firstly, layers of the charge generating layer or above were removed using methyl ethyl ketone and methanol from the electrophotographic photosensitive member prepared for X-ray diffraction measurement.

Next, the undercoat layer was cut out using a box cutter, and the cut-out undercoat layer was made into the form of a powder using a mortar and then put onto a reflection free sample holder (manufactured by Rigaku Corporation) while the powder was lightly pressed so as to be flat. The flattened sample was set in the apparatus together with the sample holder.

The measurement was conducted using MiniFlex600 (manufactured by Rigaku Corporation) under the following conditions.

In the X-ray diffraction patterns obtained by the measurement, the half-value widths were calculated for the peaks that appeared at a position of 2θ=32.20±0.20 (θ represents a Bragg angle). The calculation of the peak half-value widths was conducted using analysis software "PDXL" produced by Rigaku Corporation. The results are shown in Table 2.

[Measurement Conditions of X-ray Diffraction]
Tube bulb: Cu
Parallel beam optical system
Voltage: 40 kV
Current: 15 mA
Start angle: 3°
End angle: 60°
Sampling width: 0.02°
Scanning speed: 10.00°/min
Divergence slit: 0.625 deg
Scattering slit: 8.0 mm
Light receiving slit: 13.0 mm (Open)

Example A2

An electrophotographic photosensitive member of Example A2 was prepared in the same manner as in Example A1 except that 1.2 parts of 2,3,4-trihydroxybenzophenone added to the coating liquid for an undercoat layer in Example A1 was changed to 1.2 parts of alizarin (manufactured by Tokyo Chemical Industry Co., Ltd.), and the evaluation of electrical properties and the X-ray diffraction measurement were conducted. The results are shown in Table 2.

Example A3

An electrophotographic photosensitive member of Example A3 was prepared in the same manner as in Example A1 except that 1.2 parts of 2,3,4-trihydroxybenzophenone added to the coating liquid for an undercoat layer in Example A1 was changed to 1.2 parts of 9-fluorenone (manufactured by Tokyo Chemical Industry Co., Ltd.), and the evaluation of electrical properties and the X-ray diffraction measurement were conducted. The results are shown in Table 2.

Example A4

An electrophotographic photosensitive member of Example A4 was prepared in the same manner as in Example A1 except that 1.2 parts of 2,3,4-trihydroxybenzophenone added to the coating liquid for an undercoat layer in Example A1 was not added, and the evaluation of electrical properties and the X-ray diffraction measurement were conducted. The results are shown in Table 2.

Examples A5 to A10

Electrophotographic photosensitive members of Examples A5 to A10 were prepared in the same manner as in Example A1 except that the strontium titanate particle S-1A used for the coating liquid for an undercoat layer in Example A1 was changed to the particles S-1B to 1G, and the evaluation of electrical properties and the X-ray diffraction measurement were conducted. The results are shown in Table 2.

Example A11

An electrophotographic photosensitive member of Example A11 was prepared in the same manner as in Example A1 except that the strontium titanate particle S-1A used for the coating liquid for an undercoat layer in Example A1 was changed to the particle S-1, and the evaluation of electrical properties and the X-ray diffraction measurement were conducted. The results are shown in Table 2.

Example A12

An electrophotographic photosensitive member of Example A12 was prepared in the same manner as in Example A1 except that the strontium titanate particle S-1A used for the coating liquid for an undercoat layer in Example A1 was changed to the particle S-4A, and the evaluation of electrical properties and the X-ray diffraction measurement were conducted. The results are shown in Table 2.

Example A13

An electrophotographic photosensitive member of Example A13 was prepared in the same manner as in Example A1 except that the strontium titanate particle S-1A used for the coating liquid for an undercoat layer in Example A1 was changed to the particle S-5A, and the evaluation of electrical properties and the X-ray diffraction measurement were conducted. The results are shown in Table 2.

Example A14

An electrophotographic photosensitive member of Example A14 was prepared in the same manner as in Example A1 except that the strontium titanate particle S-1A used for the coating liquid for an undercoat layer in Example A1 was changed to the particle S-7A, and the evaluation of electrical properties and the X-ray diffraction measurement were conducted. The results are shown in Table 2.

Example A15

An electrophotographic photosensitive member of Example A15 was prepared in the same manner as in Example A1 except that the strontium titanate particle S-1A used for the coating liquid for an undercoat layer in Example A1 was changed to the particle S-2A, and the evaluation of electrical properties and the X-ray diffraction measurement were conducted. The results are shown in Table 2.

Example A16

An electrophotographic photosensitive member of Example A16 was prepared in the same manner as in Example A1 except that the strontium titanate particle S-1A used for the coating liquid for an undercoat layer in Example A1 was changed to the particle S-3A, and the evaluation of electrical properties and the X-ray diffraction measurement were conducted. The results are shown in Table 2.

Example A17

An electrophotographic photosensitive member of Example A17 was prepared in the same manner as in Example A1 except that the strontium titanate particle S-1A used for the coating liquid for an undercoat layer in Example A1 was changed to the particle S-6A, and the evaluation of electrical properties and the X-ray diffraction measurement were conducted. The results are shown in Table 2.

Example A18

An electrophotographic photosensitive member of Example A18 was prepared in the same manner as in Example A1 except that the strontium titanate particle S-1A used for the coating liquid for an undercoat layer in Example A1 was changed to the particle S-8A, and the evaluation of electrical properties and the X-ray diffraction measurement were conducted. The results are shown in Table 2.

Example A19

An electrophotographic photosensitive member of Example A19 was prepared in the same manner as in Example A1 except that the silicone oil used for the coating liquid for an undercoat layer in Example A1 was not used, and the evaluation of electrical properties and the X-ray diffraction measurement were conducted. The results are shown in Table 2.

Example A20

An electrophotographic photosensitive member of Example A20 was prepared in the same manner as in Example A1 except that 15 parts of the butyral resin and 15 parts of the blocked isocyanate each used for the coating liquid for an undercoat layer in Example A1 were changed to 25 parts of the butyral resin and 25 parts of the blocked isocyanate and 120 parts of the particle S-1A in Example A1 was changed to 100 parts, and the evaluation of electrical properties and the X-ray diffraction measurement were conducted. The results are shown in Table 2.

Example A21

An electrophotographic photosensitive member of Example A21 was prepared in the same manner as in Example A1 except that 15 parts of the butyral resin and 15 parts of the blocked isocyanate each used for the coating liquid for an undercoat layer in Example A1 were changed to 19 parts of the butyral resin and 18.5 parts of the blocked isocyanate and 120 parts of the particle S-1A in Example A1 was changed to 112.5 parts, and the evaluation of electrical properties and the X-ray diffraction measurement were conducted. The results are shown in Table 2.

Example A22

An electrophotographic photosensitive member of Example A22 was prepared in the same manner as in Example A1 except that 300 parts of methyl ethyl ketone and 300 parts of 1-butanol each used for the coating liquid for an undercoat layer in Example A1 were changed to 600 parts of THF, and the evaluation of electrical properties and the X-ray diffraction measurement were conducted. The results are shown in Table 2.

Example A23

An electrophotographic photosensitive member of Example A23 was prepared in the same manner as in Example A1 except that the film thickness of the undercoat layer was changed from 2.0 μm in Example A1 to 1.0 μm, and the evaluation of electrical properties and the X-ray diffraction measurement were conducted. The results are shown in Table 2.

Example A24

An electrophotographic photosensitive member of Example A24 was prepared in the same manner as in Example A1 except that the film thickness of the undercoat layer was changed from 2.0 μm in Example A1 to 5.0 μm, and the evaluation of electrical properties and the X-ray diffraction measurement were conducted. The results are shown in Table 2.

Example A25

An electrophotographic photosensitive member of Example A25 was prepared in the same manner as in Example A1 except that the undercoat layer in Example A1 was formed by the method described below, and the evaluation of electrical properties and the X-ray diffraction measurement were conducted. The results are shown in Table 2.

In a mixed liquid of 115 parts of methyl ethyl ketone and 115 parts of 1-butanol, 27 parts of a butyral resin (trade name: BM-1, manufactured by Sekisui Chemical Co., Ltd.) as a polyol resin and 27 parts of blocked isocyanate (trade name: Sumidule 3175, manufactured by Sumika Bayer Urethane Co., Ltd.) were dissolved.

To the solution, 135 parts of the particle S-1A as a strontium titanate particle and 1.35 parts of 2,3,4-trihydroxybenzophenone (manufactured by Tokyo Chemical Industry Co., Ltd.) as an additive were added, and a resultant mixture was dispersed with a sand mill apparatus which uses a glass bead having a diameter of 0.8 mm under an atmosphere of 23±3° C. for 3 hours.

After the dispersion, 0.02 parts of a silicone oil (trade name: SH 28 PA, manufactured by Dow Corning Toray Co., Ltd.) and 9.5 parts of a crosslinked polymethyl methacrylate (PMMA) particle (trade name: TECHPOLYMER SSX-103, manufactured by Sekisui Plastics Co., Ltd.) were added to the dispersion liquid and a resultant mixture was stirred to obtain a coating liquid for an undercoat layer.

The support was dip-coated with the obtained coating liquid for an undercoat layer and the coating liquid on the support was dried at 160° C. for 30 minutes to form an undercoat layer having a film thickness of 18.0 μm.

Example A26

An electrophotographic photosensitive member of Example A26 was prepared in the same manner as in Example A25 except that the film thickness of the undercoat layer was changed from 18 μm in Example 25 to 30.0 μm, and the evaluation of electrical properties and the X-ray diffraction measurement were conducted. The results are shown in Table 2.

Example A27

An electrophotographic photosensitive member of Example A27 was prepared in the same manner as in Example A1 except that the drying condition for the coating liquid for an undercoat layer was changed from 30 min/160° C. in Example A1 to 20 min/170° C., and the evaluation of electrical properties and the X-ray diffraction measurement were conducted. The results are shown in Table 2.

Example A28

An electrophotographic photosensitive member of Example A28 was prepared in the same manner as in Example A1 except that the drying condition for the coating liquid for an undercoat layer was changed from 30 min/160° C. in Example A1 to 50 min/150° C., and the evaluation of electrical properties and the X-ray diffraction measurement were conducted. The results are shown in Table 2.

Example A29

An electrophotographic photosensitive member of Example A29 was prepared in the same manner as in Example A1 except that an aluminum cylinder processed by the method described below was used as the support in Example A1, and the evaluation of electrical properties and the X-ray diffraction measurement were conducted. The results are shown in Table 2.

A cylindrical aluminum cylinder (diameter of 30 mm, length of 357.5 mm and a wall thickness of 0.7 mm) was attached to a lathe and cut processing was performed with a diamond sintered cutting tool so that the aluminum cylinder has an outer diameter of 30.0±0.02 mm, a deflection accuracy of 15 μm and a surface roughness of Rz=0.2 μm. In the cut processing, the number of revolutions of the main shaft was 3000 rpm, the feeding speed of the cutting tool was 0.3 mm/rev and processing time was 24 seconds excluding the time for attachment and detachment of the workpiece.

Measurement of the surface roughness was conducted according to JIS B 0601 using a surface roughness measuring instrument SURFCORDER SE3500 manufactured by Kosaka Laboratory Ltd. and setting cut off to 0.8 mm and a measurement length to 8 mm.

A liquid homing treatment was performed on the obtained aluminum cut tube using a liquid (wet) homing apparatus under the following conditions.

<Liquid Horning Conditions>

Abrasive grain of polishing material=spherical alumina bead having an average particle diameter of 30 μm
(trade name: CB-A30S, manufactured by Showa Denko K.K.)
Suspension medium=water
Polishing material/suspension medium=1/9 (volume ratio)
Number of revolutions of aluminum cut tube=1.67 $S^{-1}$
Air blow pressure=0.15 MPa
Moving speed of gun=13.3 mm/sec.
Distance between gun nozzle and aluminum tube=200 mm
Discharge angle of abrasive grain for horning=45°
Number of projection of polishing liquid=1 (One way)

With respect to the surface roughness of the cylinder after the horning, Rmax was 2.53 μm, Rz was 1.51 μm, Ra was 0.23 μm and Sm was 34 The aluminum cylinder was dipped once into a dipping vat filled with pure water immediately after the wet horning treatment was applied in the manner as described above, the aluminum cylinder was then drawn up, and pure water shower washing was applied to the cylinder before the cylinder was dried. Thereafter, warm water of 85° C. was discharged from a discharge nozzle to the inner surface of the base to make the warm water into contact with the inner surface, and the outer surface was dried. Thereafter, the inner surface of the base was air-dried.

The aluminum cylinder on which surface processing was performed in the manner as described above was used as the support of the electrophotographic photosensitive member.

Example A30

An electrophotographic photosensitive member of Example A30 was prepared in the same manner as in Example A1 except that an aluminum cylinder processed by the method described below was used as the support in Example A1, and the evaluation of electrical properties and the X-ray diffraction measurement were conducted. The results are shown in Table 2.

A cylindrical aluminum cylinder was attached to a lathe and cut processing was performed using a single crystal diamond cutting tool (tip R of 20 mm). In the cut processing, the number of revolutions of the main shaft was 3000 rpm, the feeding speed of the cutting tool was 5 mm/rev.

Example A31

An electrophotographic photosensitive member of Example A31 was prepared in the same manner as in Example A1 except that the electro-conductive layer described below was provided between the support and the undercoat layer in Example A1, and the evaluation of electrical properties and the X-ray diffraction measurement were conducted. The results are shown in Table 2.

A dispersion liquid was prepared by dispersing 57 parts of a titanium oxide particle having an enveloping layer (trade name: Passtran LRS, manufactured by MITSUI MINING & SMELTING CO., LTD.), 35 parts of a resol type phenolic resin (trade name: PHENOLITE J-325, manufactured by DIC corporation (former Dainippon Ink and Chemicals, Inc.), methanol solution having solid content of 60%) and 33 parts of 2-methoxy-1-propanol with a sand mill which uses a glass bead having a diameter of 1 mm for 3 hours. The average particle diameter of the powder contained in the dispersion liquid was 0.30 µm.

To the dispersion liquid, a liquid obtained by dispersing 8 parts of a silicone resin (trade name: Tospearl 120, manufactured by Momentive Performance Materials Japan LLC. (former Toshiba Silicone Co., Ltd.)) in 8 parts of 2-methoxy-1-propanol was added. Further, 0.008 parts of a silicone oil (trade name: SH 28 PA, manufactured by Dow Corning Toray Co., Ltd. (former Toray Silicone Co., Ltd.)) was added thereto.

The aluminum cylinder was coated with the dispersion liquid thus prepared by a dipping method, and the dispersion liquid on the aluminum cylinder was cured by heating for 30 minutes in a hot air dryer in which the temperature was adjusted to 150° C. to cure the coating film of the dispersion liquid, and an electro-conductive layer having a film thickness of 30 µm was thereby formed.

Example A32

An electrophotographic photosensitive member of Example A32 was prepared in the same manner as in Example A1 except that a coating liquid for a surface layer (coating liquid for protective layer), the coating liquid prepared by the method described below, was used in the formation of the surface layer (protective layer) in Example A1, and the evaluation of electrical properties and the X-ray diffraction measurement were conducted. The results are shown in Table 2.

The compound represented by the formula (F) in an amount of 100 parts, 200 parts of 1-propanol and 100 parts of 1,1,2,2,3,3,4-heptafluorocyclopentane (trade name: ZEORORA H, manufactured by Zeon Corporation) were mixed and stirred.

Thereafter, the solution was filtrated with a polyflon filter (trade name: PF-020, manufactured by Advantec Toyo Kaisha, Ltd.) to prepare a coating liquid for a surface layer (coating liquid for protective layer).

Example A33

An electrophotographic photosensitive member of Example A33 was prepared in the same manner as in Example A1 except that a coating liquid for a surface layer (coating liquid for protective layer), the coating liquid prepared by the method described below, was used in the formation of the surface layer (protective layer) in Example A1, and the evaluation of electrical properties and the X-ray diffraction measurement were conducted. The results are shown in Table 2.

In a mixed solvent of 45 parts of 1,1,2,2,3,3,4-heptafluorocyclopentane (trade name: ZEORORA H, manufactured ty Zeon Corporation) and 45 parts of 1-propanol, 1.5 parts of a fluorine atom-containing resin (trade name: GF-300, manufactured by Toagosei Co., Ltd.) was dissolved.

Thereafter, a mixed liquid obtained by adding to the solution 30 parts of a tetrafluoroethylene resin powder (trade name: Lubron L-2, manufactured by Daikin Industries, Ltd.) was allowed to pass through a high-pressure disperser (trade name: Microfluidizer M-110EH, manufactured by Microfluidics Corp.) to obtain a dispersion liquid.

Thereafter, 70 parts of the compound represented by the formula (F), 30 parts of 1,1,2,2,3,3,4-heptafluorocyclopentane and 30 parts of 1-propanol were added to the dispersion liquid and a resultant liquid was filtrated with a polyflon filter (trade name: PF-040, manufactured by Advantec Toyo Kaisha, Ltd.) to prepare a coating liquid for a surface layer (coating liquid for protective layer).

Example A34

An electrophotographic photosensitive member of Example A34 was prepared in the same manner as in Example A1 except that the surface processing of the electrophotographic photosensitive member in Example A1 was changed to processing using the polishing apparatus described below, and the evaluation of electrical properties and the X-ray diffraction measurement were conducted. The results are shown in Table 2.

The surface of the electrophotographic photosensitive member before surface polishing was polished. The polishing was performed using the polishing apparatus illustrated in FIG. 3 under the following conditions.

Feeding speed of polishing sheet; 400 mm/min
Number of revolutions of electrophotographic photosensitive member; 450 rpm
Pushing of electrophotographic photosensitive member into backup roller; 3.5 mm
Directions of rotation of polishing sheet and electrophotographic photosensitive member; with
Backup roller; outer diameter of 100 mm and Asker C hardness of 25

A polishing sheet A to be attached to the polishing apparatus was prepared by mixing abrasive grains which are used in GC3000 and GC2000 each manufactured by RIKEN CORUNDUM CO., LTD.

GC3000 (surface roughness Ra of polishing sheet of 0.83 µm)
GC2000 (surface roughness Ra of polishing sheet of 1.45 µm)
Polishing sheet A (surface roughness Ra of polishing sheet of 1.12 µm)

The time for polishing using the polishing sheet A was 20 seconds.

Example A35

An electrophotographic photosensitive member of Example A35 was prepared in the same manner as in Example A1 except that the surface layer (protective layer) in Example A1 was not provided and the charge transporting layer in Example 1 was formed by the method described below, and the evaluation of electrical properties and the X-ray diffraction measurement were conducted. The results are shown in Table 2.

The compound represented by the formula (B) (charge transporting substance) in an amount of 72 parts,
8 parts of the compound represented by the formula (D) (charge transporting substance), 100 parts of a resin having a structure represented by the following formula (I),
1.8 parts of a resin having a structure represented by the following formula (J),
360 parts of o-xylene,
160 parts of methyl benzoate and
270 parts of dimethoxymethane (methylal)
were mixed and used as a coating liquid for a charge transporting layer.

Subsequently, the charge generating layer was dip-coated with the coating liquid for a charge transporting layer, and an obtained coating film was dried at 125° C. for 50 minutes to form a charge transporting layer having a film thickness of 20 μm.

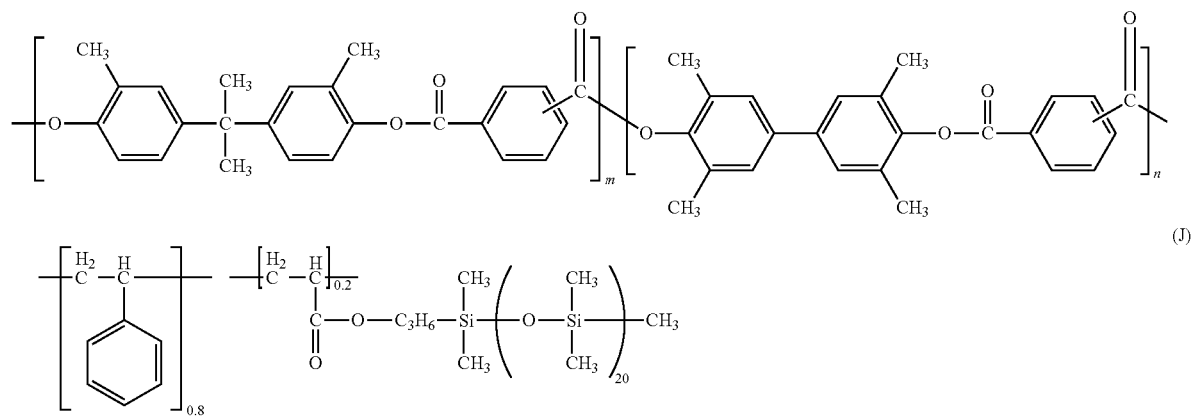

(wherein, m and n denote a copolymerization ratio and m:n=7:3)

Example A36

An electrophotographic photosensitive member of Example A36 was prepared in the same manner as in Example A1 except that 15 parts of the butyral resin and 15 parts of blocked isocyanate each used for the coating liquid for an undercoat layer in Example A1 were changed to 30 parts of a phenolic resin (trade name: Plyophen J-325, manufactured by DIC Corporation), and 300 parts of methyl ethyl ketone and 300 parts of 1-butanol in Example A1 were changed to 300 parts of methanol and 300 parts of 1-methoxy-2-propanol, and the evaluation of electrical properties and the X-ray diffraction measurement were conducted. The results are shown in Table 2.

Example A37

An electrophotographic photosensitive member of Example A37 was prepared in the same manner as in Example A1 except that 15 parts of the butyral resin and 15 parts of blocked isocyanate each used for the coating liquid for an undercoat layer in Example A1 were changed to 30 parts of an alcohol-soluble copolymerized polyamide (trade name: Amilan CM8000, manufactured by Toray Industries, Inc.), and 300 parts of methyl ethyl ketone in Example A1 was changed to 300 parts of methanol, and the evaluation of electrical properties and the X-ray diffraction measurement were conducted. The results are shown in Table 2.

Example A38

An electrophotographic photosensitive member of Example A38 was prepared in the same manner as in Example A1 except that the strontium titanate particle S-1A used for the coating liquid for an undercoat layer in Example A1 was changed to the particle S-9A, and the evaluation of electrical properties and the X-ray diffraction measurement were conducted. The results are shown in Table 2.

Example A39

An electrophotographic photosensitive member of Example A39 was prepared in the same manner as in Example A1 except that the strontium titanate particle S-1A used for the coating liquid for an undercoat layer in Example A1 was changed to the particle S-11A, and the evaluation of electrical properties and the X-ray diffraction measurement were conducted. The results are shown in Table 2.

Example A40

An electrophotographic photosensitive member of Example A40 was prepared in the same manner as in Example A1 except that the strontium titanate particle S-1A used for the coating liquid for an undercoat layer in Example A1 was changed to the particle S-12A, and the evaluation of electrical properties and the X-ray diffraction measurement were conducted. The results are shown in Table 2.

Example A41

An electrophotographic photosensitive member of Example A41 was prepared in the same manner as in Example A1 except that the undercoat layer in Example A1 was formed by the method described below, and the evaluation of electrical properties and the X-ray diffraction measurement were conducted. The results are shown in Table 2.

<Production Example for Ammonia-Reduced Niobium Oxide Particle N-1>

A reduction treatment was performed on a niobium pentoxide fine powder having an average primary particle diameter of 60 nm at 700° C. for 6 hours under an ammonia gas flow at a linear flow rate of 3 cm/sec. Subsequently, a 10% hydrochloric acid aqueous solution was added to an obtained powder and a resultant mixture was stirred and left to stand. An obtained supernatant liquid was removed, decantation with water was then performed twice, and a residue obtained through separation by filtration was dried. Pulverization treatment was applied to the obtained residue to obtain a powder of a particle N-1 having an average primary particle diameter of 60 nm. The element ratios of the obtained particle N-1 were analyzed by the ESCA analysis described below. Measurement conditions are as follows.

<ESCA Analysis>
Apparatus used: VersaProbe II manufactured by ULVAC-PHI, Inc.
X-ray source: Al Kα 1486.6 eV (25 W 15 kV)
Measurement area: ϕ100 μm
Spectroscopic region: 300×200 μm, angle of 45°
Pass Energy: 58.70 eV
Step Size: 0.125 eV From the peak intensities of respective elements measured under the above conditions, the surface atom concentrations (atoms %) are calculated using relative sensitive factors provided by ULVAC-PHI, Inc. Adopted peak top ranges of respective elements are as follows.

O: Energy of photoelectron originating from is orbital: 525 to 545 eV
N: Energy of photoelectron originating from is orbital: 390 to 410 eV
Nb: Energy of photoelectron originating from 2p orbital: 197 to 217 eV It is to be noted that the measurement was conducted after Ar ion sputtering was performed at an intensity of 0.5 to 4.0 kV in order to exclude an influence of surface contamination.

As a result of the measurement, in the formula (N), the value of X was found to be 1.16 and the value of Y was found to be 0.78 for the particle N-1.

Subsequently, 15 parts of a butyral resin (trade name: BM-1, manufactured by Sekisui Chemical Co., Ltd.) as a polyol resin and 15 parts of blocked isocyanate (trade name: Sumidule 3175, manufactured by Sumika Bayer Urethane Co., Ltd.) were dissolved in a mixed liquid of 115 parts of methyl ethyl ketone and 115 parts of 1-butanol.

To the solution, 94.5 parts of the particle S-3A as a strontium titanate particle, 40.5 parts of the particle N-1 and 1.35 parts of 2,3,4-trihydroxybenzophenone (manufactured by Tokyo Chemical Industry Co., Ltd.) as an additive were added, and a resultant mixture was dispersed with a sand mill apparatus which uses a glass bead having a diameter of 0.8 mm under an atmosphere of 23±3° C. for 3 hours.

After the dispersion, 0.02 parts of a silicone oil (trade name: SH 28 PA, manufactured by Dow Corning Toray Co., Ltd.) and 9.5 parts of a crosslinked polymethyl methacrylate (PMMA) particle (trade name: TECHPOLYMER SSX-103, manufactured by Sekisui Plastics Co., Ltd.) were added to the dispersion liquid and a resultant mixture was stirred to obtain a coating liquid for an undercoat layer.

The support was dip-coated with the obtained coating liquid for an undercoat layer and the coating liquid on the support was dried at 160° C. for 30 minutes to form an undercoat layer having a film thickness of 30.0 μm.

Example A42

An electrophotographic photosensitive member of Example A42 was prepared in the same manner as in Example A41 except that 94.5 parts of the particle S-3A and 40.5 parts of the particle N-1 each used for the coating liquid for an undercoat layer in Example A41 were changed to 67.5 parts of the particle S-3A and 67.5 parts of the particle N-1, and the evaluation was conducted. The results are shown in Table 2.

Example A43

An electrophotographic photosensitive member of Example A43 was prepared in the same manner as in Example A41 except that 94.5 parts of the particle S-3A and 40.5 parts of the particle N-1 each used for the coating liquid for an undercoat layer in Example A41 were changed to 128.25 parts of the particle S-3A and 6.75 parts of the particle N-1, and the evaluation was conducted. The results are shown in Table 2.

Example A44

An electrophotographic photosensitive member of Example A44 was prepared in the same manner as in Example A41 except that the film thickness of the undercoat layer was changed from 30.0 μm in Example A41 to 15.0 μm, and the evaluation was conducted. The results are shown in Table 2.

Example A45

An electrophotographic photosensitive member of Example A45 was prepared in the same manner as in Example A42 except that the film thickness of the undercoat layer was changed from 30.0 μm in Example A42 to 15.0 μm, and the evaluation was conducted. The results are shown in Table 2.

Example A46

An electrophotographic photosensitive member of Example A46 was prepared in the same manner as in Example A43 except that the film thickness of the undercoat layer was changed from 30.0 μm in Example A43 to 15.0 μm, and the evaluation was conducted. The results are shown in Table 2.

Example A47

An electrophotographic photosensitive member of Example A47 was prepared in the same manner as in Example A1 except that the strontium titanate particle S-1A used for the coating liquid for an undercoat layer in Example A1 was changed to the particle S-14A, and the evaluation of electrical properties and the X-ray diffraction measurement were conducted. The results are shown in Table 2.

Comparative Example A1

An electrophotographic photosensitive member of Comparative Example A1 was prepared in the same manner as in Example A1 except that the strontium titanate particle S-1A used for the coating liquid for an undercoat layer in Example A1 was changed to the particle S-13A, and the evaluation of electrical properties and the X-ray diffraction measurement were conducted. The results are shown in Table 2.

Comparative Example A2

An electrophotographic photosensitive member of Comparative Example A2 was prepared in the same manner as in Example A1 except that the strontium titanate particle S-1A used for the coating liquid for an undercoat layer in Example A1 was changed to the particle S-10A, and the evaluation of electrical properties and the X-ray diffraction measurement were conducted. The results are shown in Table 2.

TABLE 2

| | Half-value width of strontium titanate particle in undercoat layer [deg] | Evaluation 1 | | | |
|---|---|---|---|---|---|
| | | Charging characteristic | | Residual potential | |
| | | Potential $|Vd1|$ [V] | Rank | Potential $|Vr1|$ [V] | Rank |
| Example A1 | 0.33 | 800 | A | 40 | A |
| Example A2 | 0.33 | 800 | A | 42 | A |
| Example A3 | 0.33 | 800 | A | 54 | A |
| Example A4 | 0.33 | 800 | A | 65 | A |
| Example A5 | 0.33 | 798 | A | 40 | A |
| Example A6 | 0.33 | 800 | A | 45 | A |
| Example A7 | 0.33 | 800 | A | 45 | A |
| Example A8 | 0.33 | 800 | A | 42 | A |
| Example A9 | 0.33 | 800 | A | 43 | A |
| Example A10 | 0.33 | 800 | A | 43 | A |
| Example A11 | 0.33 | 785 | A | 65 | A |
| Example A12 | 0.50 | 802 | A | 48 | A |
| Example A13 | 0.23 | 795 | A | 40 | A |
| Example A14 | 0.23 | 795 | A | 46 | A |
| Example A15 | 0.40 | 800 | A | 43 | A |
| Example A16 | 0.28 | 800 | A | 42 | A |
| Example A17 | 0.23 | 795 | A | 40 | A |
| Example A18 | 0.23 | 795 | A | 40 | A |
| Example A19 | 0.33 | 800 | A | 40 | A |
| Example A20 | 0.33 | 803 | A | 55 | A |
| Example A21 | 0.33 | 800 | A | 45 | A |
| Example A22 | 0.33 | 800 | A | 40 | A |
| Example A23 | 0.33 | 798 | A | 40 | A |
| Example A24 | 0.33 | 800 | A | 48 | A |
| Example A25 | 0.33 | 805 | A | 53 | A |
| Example A26 | 0.33 | 810 | A | 56 | A |
| Example A27 | 0.33 | 800 | A | 40 | A |
| Example A28 | 0.33 | 800 | A | 47 | A |
| Example A29 | 0.33 | 800 | A | 40 | A |
| Example A30 | 0.33 | 800 | A | 40 | A |
| Example A31 | 0.33 | 800 | A | 55 | A |
| Example A32 | 0.33 | 800 | A | 40 | A |
| Example A33 | 0.33 | 800 | A | 40 | A |
| Example A34 | 0.33 | 800 | A | 40 | A |
| Example A35 | 0.33 | 800 | A | 40 | A |
| Example A36 | 0.33 | 800 | A | 47 | A |
| Example A37 | 0.33 | 800 | A | 49 | A |
| Example A38 | 0.18 | 670 | C | 34 | A |
| Example A39 | 0.15 | 663 | C | 34 | A |
| Example A40 | 0.10 | 655 | C | 34 | A |
| Example A41 | 0.28 | 798 | A | 41 | A |
| Example A42 | 0.28 | 796 | A | 40 | A |
| Example A43 | 0.28 | 800 | A | 42 | A |
| Example A44 | 0.28 | 798 | A | 41 | A |
| Example A45 | 0.28 | 796 | A | 40 | A |
| Example A46 | 0.28 | 800 | A | 42 | A |
| Example A47 | 0.15 | 663 | C | 45 | A |
| Comparative Example A1 | 0.08 | 630 | D | 33 | A |
| Comparative Example A2 | 0.55 | 810 | A | 142 | C |

Next, electrophotographic photosensitive members of Examples B1 to B47 and Comparative Examples B1 to B2 were prepared in the same manner as in Examples A1 to A47 and Comparative Examples A1 to A2 except that an aluminum cylinder with length of 357.5 mm, a wall thickness of 1.0 mm and diameter of 30.5 mm was used as a support (electro-conductive support) and an evaluation 2 of electrical properties were conducted. The results are shown in Table 3.

[Evaluation of Electrophotographic Photosensitive Member]

<Evaluation 2 of Electrical Properties of Electrophotographic Photosensitive Member>

As an evaluation 2 of electrical properties of electrophotographic photosensitive member, a cyan station of a modified machine of an electrophotographic apparatus image-PRESS C850 manufactured by Canon Inc. was used. Evaluation was conducted using as a charging unit a system of applying direct-current voltage to a roller type contact charging member (charging roller).

The evaluation apparatus was installed under an environment of a temperature of 23° C. and a relative humidity of 50% RH. Measurement of the surface potential of the electrophotographic photosensitive member was conducted by taking out a developing cartridge from the evaluation apparatus and inserting a potential measurement apparatus therein. The potential measurement apparatus is configured by disposing a potential measurement probe at a developing position of the developing cartridge and the position of the potential measurement probe was at the center of the electrophotographic photosensitive member in the bus line.

The surface potential (dark part potential) Vd2 of the electrophotographic photosensitive member when the direct voltage −830 V being overlapped with 2000 Hz1500 Vpp alternating voltage was applied to the charging member (charging roller) was evaluated as evaluation of a charging characteristic. The results are shown in Table 3.

The charging characteristic was evaluated as rank A when the absolute value of the dark part potential Vd2, $|Vd2|$, measured under the above-described evaluation conditions is 750 V or more, as rank B when 700 V or more, as rank C when 650 V or more and as rank D when less than 650 V.

Next, the direct voltage applied to the charging member (charging roller) was adjusted so that the dark potential Vd2 was −700 V. The laser light quantity was adjusted so that bright part potential Vl2 was −200 V when irradiation with laser light having a wavelength of 680 nm was performed and residual potential Vr2 was evaluated after 10 sheets of a solid black image were printed out. The results are shown in Table 3.

The residual potential was evaluated as rank A when the absolute value of the residual potential Vr2, $|Vr2|$, measured under the above-described conditions is 70 V or less, as rank B when 100 V or less and as rank C when larger than 100 V.

TABLE 3

| | Evaluation | | | |
|---|---|---|---|---|
| | Charging characteristic | | Residual potential | |
| | Potential $|Vd2|$ [V] | Rank | Potential $|Vr2|$ [V] | Rank |
| Example B1 | 800 | A | 41 | A |
| Example B2 | 800 | A | 44 | A |
| Example B3 | 800 | A | 57 | A |
| Example B4 | 800 | A | 68 | A |
| Example B5 | 800 | A | 41 | A |
| Example B6 | 800 | A | 47 | A |
| Example B7 | 800 | A | 47 | A |
| Example B8 | 800 | A | 44 | A |
| Example B9 | 800 | A | 45 | A |
| Example B10 | 800 | A | 45 | A |
| Example B11 | 793 | A | 68 | A |
| Example B12 | 800 | A | 50 | A |
| Example B13 | 800 | A | 41 | A |

TABLE 3-continued

| | Evaluation | | | |
|---|---|---|---|---|
| | Charging characteristic | | Residual potential | |
| | Potential \|Vd2\| [V] | Rank | Potential \|Vr2\| [V] | Rank |
| Example B14 | 800 | A | 48 | A |
| Example B15 | 800 | A | 45 | A |
| Example B16 | 800 | A | 44 | A |
| Example B17 | 800 | A | 41 | A |
| Example B18 | 800 | A | 41 | A |
| Example B19 | 800 | A | 41 | A |
| Example B20 | 800 | A | 58 | A |
| Example B21 | 800 | A | 47 | A |
| Example B22 | 800 | A | 41 | A |
| Example B23 | 800 | A | 41 | A |
| Example B24 | 800 | A | 50 | A |
| Example B25 | 800 | A | 56 | A |
| Example B26 | 805 | A | 59 | A |
| Example B27 | 800 | A | 41 | A |
| Example B28 | 800 | A | 49 | A |
| Example B29 | 800 | A | 41 | A |
| Example B30 | 800 | A | 41 | A |
| Example B31 | 800 | A | 58 | A |
| Example B32 | 800 | A | 41 | A |
| Example B33 | 800 | A | 41 | A |
| Example B34 | 800 | A | 41 | A |
| Example B35 | 800 | A | 41 | A |
| Example B36 | 800 | A | 49 | A |
| Example B37 | 800 | A | 51 | A |
| Example B38 | 760 | A | 38 | A |
| Example B39 | 760 | A | 38 | A |
| Example B40 | 760 | A | 38 | A |
| Example B41 | 800 | A | 43 | A |
| Example B42 | 800 | A | 41 | A |
| Example B43 | 800 | A | 44 | A |
| Example B44 | 800 | A | 43 | A |
| Example B45 | 800 | A | 41 | A |
| Example B46 | 800 | A | 44 | A |
| Example B47 | 760 | A | 47 | A |
| Comparative Example B1 | 720 | B | 36 | A |
| Comparative Example B2 | 800 | A | 151 | C |

Next, electrophotographic photosensitive members of Examples C1 to C47 and Comparative Examples C1 to C2 were prepared in the same manner as in Examples A1 to A47 and Comparative Examples A1 to A2 except that an aluminum cylinder with length of 370.0 mm, a wall thickness of 3.0 mm and diameter of 84.0 mm was used as a support (electro-conductive support) and an evaluation 3 of electrical properties were conducted. The results are shown in Table 4.

[Evaluation of Electrophotographic Photosensitive Member]

<Evaluation 3 of Electrical Properties of Electrophotographic Photosensitive Member>

As an evaluation 3 of electrical properties of electrophotographic photosensitive member, a black station of a modified machine of an electrophotographic apparatus image-PRESS C850 manufactured by Canon Inc. was used. Evaluation was conducted using as a charging unit a corona charging system of applying a voltage to a grid and wire which do not contact with a photosensitive member.

The evaluation apparatus was installed under an environment of a temperature of 23° C. and a relative humidity of 50% RH. Measurement of the surface potential of the electrophotographic photosensitive member was conducted by taking out a developing cartridge from the evaluation apparatus and inserting a potential measurement apparatus therein. The potential measurement apparatus is configured by disposing a potential measurement probe at a developing position of the developing cartridge and the position of the potential measurement probe was at the center of the electrophotographic photosensitive member in the bus line.

The surface potential (dark part potential) Vd3 of the electrophotographic photosensitive member when the wire current −1000 μA and the grid voltage −850 V was applied to the charging member (charging roller) was evaluated as evaluation of a charging characteristic. The results are shown in Table 4.

The charging characteristic was evaluated as rank A when the absolute value of the dark part potential Vd3, |Vd3| measured under the above-described evaluation conditions is 750 V or more, as rank B when 700 V or more, as rank C when 650 V or more and as rank D when less than 650 V.

Next, the grid voltage was adjusted so that the dark potential Vd3 was −700 V. The laser light quantity was adjusted so that bright part potential Vl3 was −200 V when irradiation with laser light having a wavelength of 680 nm was performed and residual potential Vr3 was evaluated after 10 sheets of a solid black image were printed out. The results are shown in Table 4.

The residual potential was evaluated as rank A when the absolute value of the residual potential Vr3, |Vr3|, measured under the above-described conditions is 70 V or less, as rank B when 100 V or less and as rank C when larger than 100 V.

TABLE 4

| | Evaluation 3 | | | |
|---|---|---|---|---|
| | Charging characteristic | | Residual potential | |
| | Potential \|Vd3\| [V] | Rank | Potential \|Vr3\| [V] | Rank |
| Example C1 | 800 | A | 40 | A |
| Example C2 | 800 | A | 41 | A |
| Example C3 | 800 | A | 52 | A |
| Example C4 | 800 | A | 62 | A |
| Example C5 | 800 | A | 40 | A |
| Example C6 | 800 | A | 44 | A |
| Example C7 | 800 | A | 44 | A |
| Example C8 | 800 | A | 41 | A |
| Example C9 | 800 | A | 42 | A |
| Example C10 | 800 | A | 42 | A |
| Example C11 | 790 | A | 62 | A |
| Example C12 | 802 | A | 47 | A |
| Example C13 | 798 | A | 40 | A |
| Example C14 | 798 | A | 45 | A |
| Example C15 | 800 | A | 42 | A |
| Example C16 | 800 | A | 41 | A |
| Example C17 | 798 | A | 40 | A |
| Example C18 | 798 | A | 40 | A |
| Example C19 | 800 | A | 40 | A |
| Example C20 | 802 | A | 43 | A |
| Example C21 | 800 | A | 44 | A |
| Example C22 | 800 | A | 40 | A |
| Example C23 | 800 | A | 40 | A |
| Example C24 | 800 | A | 48 | A |
| Example C25 | 802 | A | 51 | A |
| Example C26 | 805 | A | 54 | A |
| Example C27 | 800 | A | 40 | A |
| Example C28 | 800 | A | 46 | A |
| Example C29 | 800 | A | 40 | A |
| Example C30 | 800 | A | 40 | A |
| Example C31 | 800 | A | 53 | A |
| Example C32 | 800 | A | 40 | A |
| Example C33 | 800 | A | 40 | A |
| Example C34 | 800 | A | 40 | A |
| Example C35 | 800 | A | 40 | A |
| Example C36 | 800 | A | 46 | A |

TABLE 4-continued

|  | Evaluation 3 | | | |
|---|---|---|---|---|
|  | Charging characteristic | | Residual potential | |
|  | Potential \|Vd3\| [V] | Rank | Potential \|Vr3\| [V] | Rank |
| Example C37 | 800 | A | 48 | A |
| Example C38 | 730 | B | 34 | A |
| Example C39 | 730 | B | 34 | A |
| Example C40 | 730 | B | 34 | A |
| Example C41 | 800 | A | 40 | A |
| Example C42 | 798 | A | 40 | A |
| Example C43 | 800 | A | 41 | A |
| Example C44 | 800 | A | 40 | A |
| Example C45 | 798 | A | 40 | A |
| Example C46 | 800 | A | 41 | A |
| Example C47 | 730 | B | 44 | A |
| Comparative Example C1 | 690 | C | 33 | A |
| Comparative Example C2 | 800 | A | 135 | C |

As shown in Tables 2, 3, and 4, the electrophotographic photosensitive member including an undercoat layer containing a strontium titanate particle according to the present invention, and the process cartridge and the electrophotographic apparatus each provided with the electrophotographic photosensitive member suppress residual potential and, further, have good charging properties.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-088699, filed Apr. 27, 2017, Japanese Patent Application No. 2017-196814, filed Oct. 10, 2017, and Japanese Patent Application No. 2018-080774, filed Apr. 19, 2018, which are hereby incorporated by reference herein in their entirety.

What is claimed is:

1. An electrophotographic photosensitive member comprising: a support; an undercoat layer; and a photosensitive layer in the mentioned order, wherein
the undercoat layer comprises a binder resin and a strontium titanate particle,
the strontium titanate particle has a maximum peak at a position of $2\theta=32.20\pm0.20$ ($\theta$ represents a Bragg angle) in a CuK$\alpha$ characteristic X-ray diffraction pattern, and a half-value width of the maximum peak is 0.10 deg or more and 0.50 deg or less.

2. The electrophotographic photosensitive member according to claim 1, wherein a primary particle of the strontium titanate particle has a number average particle diameter of 10 nm or more and 150 nm or less.

3. The electrophotographic photosensitive member according to claim 1, wherein the half-value width is 0.23 deg or more.

4. The electrophotographic photosensitive member according to claim 1, wherein a primary particle of the strontium titanate particle has a number average particle diameter of 10 nm or more and 95 nm or less.

5. The electrophotographic photosensitive member according to claim 1, wherein the strontium titanate particle is surface-treated with a surface treating agent.

6. The electrophotographic photosensitive member according to claim 5, wherein the surface treating agent is a silane coupling agent.

7. The electrophotographic photosensitive member according to claim 6, wherein the silane coupling agent is a silane coupling agent comprising at least one functional group selected from the group consisting of alkyl groups, amino groups and halogen atoms.

8. The electrophotographic photosensitive member according to claim 1, wherein the undercoat layer comprises an electron accepting substance.

9. The electrophotographic photosensitive member according to claim 1, wherein the undercoat layer comprises at least one compound selected from groups represented by the following formulas (1) and (2):

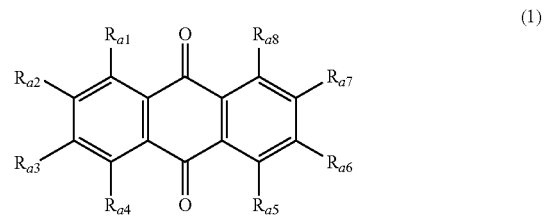

(1)

wherein $R_{a1}$ to $R_{a8}$ each independently represent a hydrogen atom, a hydroxy group, a halogen atom, an alkyl group, an alkoxy group, a phenyl group or an amino group;

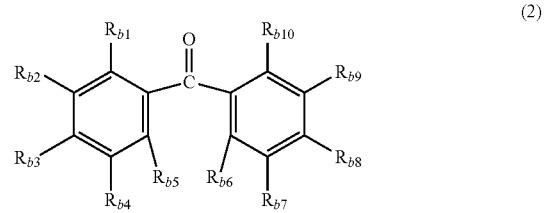

(2)

wherein $R_{b1}$ to $R_{b10}$ each independently represent a hydrogen atom, a hydroxy group, a halogen atom, an alkyl group, an alkoxy group, a phenyl group or an amino group.

10. A process cartridge integrally supporting: an electrophotographic photosensitive member; and at least one unit selected from the group consisting of a charging unit, a developing unit, a transfer unit and a cleaning unit, the process cartridge being detachably attachable to an electrophotographic apparatus main body, wherein
the electrophotographic photosensitive member comprises: a support; an undercoat layer; and a photosensitive layer in the mentioned order,
the undercoat layer comprises a binder resin and a strontium titanate particle,
the strontium titanate particle has a maximum peak at a position of $2\theta=32.20\pm0.20$ ($\theta$ represents a Bragg angle) in a CuK$\alpha$ characteristic X-ray diffraction pattern, and a half-value width of the maximum peak is 0.10 deg or more and 0.50 deg or less.

11. An electrophotographic apparatus comprising: a photoelectric photosensitive member; a charging unit; an exposing unit; a developing unit; and a transfer unit, wherein the electrophotographic photosensitive member comprises: a support; an undercoat layer; and
a photosensitive layer in the mentioned order,
the undercoat layer comprises a binder resin and a strontium titanate particle,
the strontium titanate particle has a maximum peak at a position of $2\theta=32.20\pm0.20$ ($\theta$ represents a Bragg angle) in a CuKα characteristic X-ray diffraction pattern, and
a half-value width of the maximum peak is 0.10 deg or more and 0.50 deg or less.

12. The electrophotographic apparatus according to claim 11, comprising as the charging unit: a charging roller disposed on the electrophotographic photosensitive member so as to be in contact with the electrophotographic photosensitive member; and the charging roller that charges the electrophotographic photosensitive member by applying only direct-current voltage to the charging roller.

\* \* \* \* \*